United States Patent
Cheung

(10) Patent No.: US 8,183,943 B2
(45) Date of Patent: May 22, 2012

(54) OSCILLATOR AND PHASE SYNCHRONIZING CIRCUIT

(75) Inventor: Tszshing Cheung, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 119 days.

(21) Appl. No.: 12/816,606

(22) Filed: Jun. 16, 2010

(65) Prior Publication Data

US 2010/0321073 A1    Dec. 23, 2010

(30) Foreign Application Priority Data

Jun. 17, 2009  (JP) .................................. 2009-144676

(51) Int. Cl.
    *H03B 5/18*    (2006.01)
(52) U.S. Cl. ..... 331/107 SL; 331/16; 331/96; 331/107 DP; 331/181
(58) Field of Classification Search ............. 331/16, 331/96, 107 DP, 107 SL, 181
    See application file for complete search history.

(56) References Cited

U.S. PATENT DOCUMENTS

| 7,852,176 B2 * | 12/2010 | Chang et al. ................ 333/246 |
| 2005/0093637 A1 * | 5/2005 | Hajimiri et al. ......... 331/107 DP |
| 2005/0174182 A1 | 8/2005 | Aikawa et al. |

FOREIGN PATENT DOCUMENTS

| JP | 2005-217752 A | 8/2005 |
| JP | 2008-118550 A | 5/2008 |

OTHER PUBLICATIONS

Jee, Jri "A 75-GHz PLL in 90-nm CMOS Technology", ISSCC 2007/Session 23/Broadband RF and Radar/Aug. 23, 2007, 432-433.

* cited by examiner

*Primary Examiner* — James E Goodley
(74) *Attorney, Agent, or Firm* — Fujitsu Patent Center

(57) ABSTRACT

When a direct-current voltage is applied from a power supply, a signal line generates a standing wave having the ¾ wavelength where a starting end of the signal line connected to the power supply is used as a node and a terminating end is used as an antinode. Strips are connected to a ground layer through switches, respectively. The switches switch connection and non-connection of the strips and the ground layer, under the control from a switch controller. By switching the connection and non-connection of the switches, the distance between the signal line and the ground layer is pseudo adjusted and the effective permittivity in a transmission line unit changes. Therefore, the frequency of the standing wave can be adjusted.

17 Claims, 25 Drawing Sheets

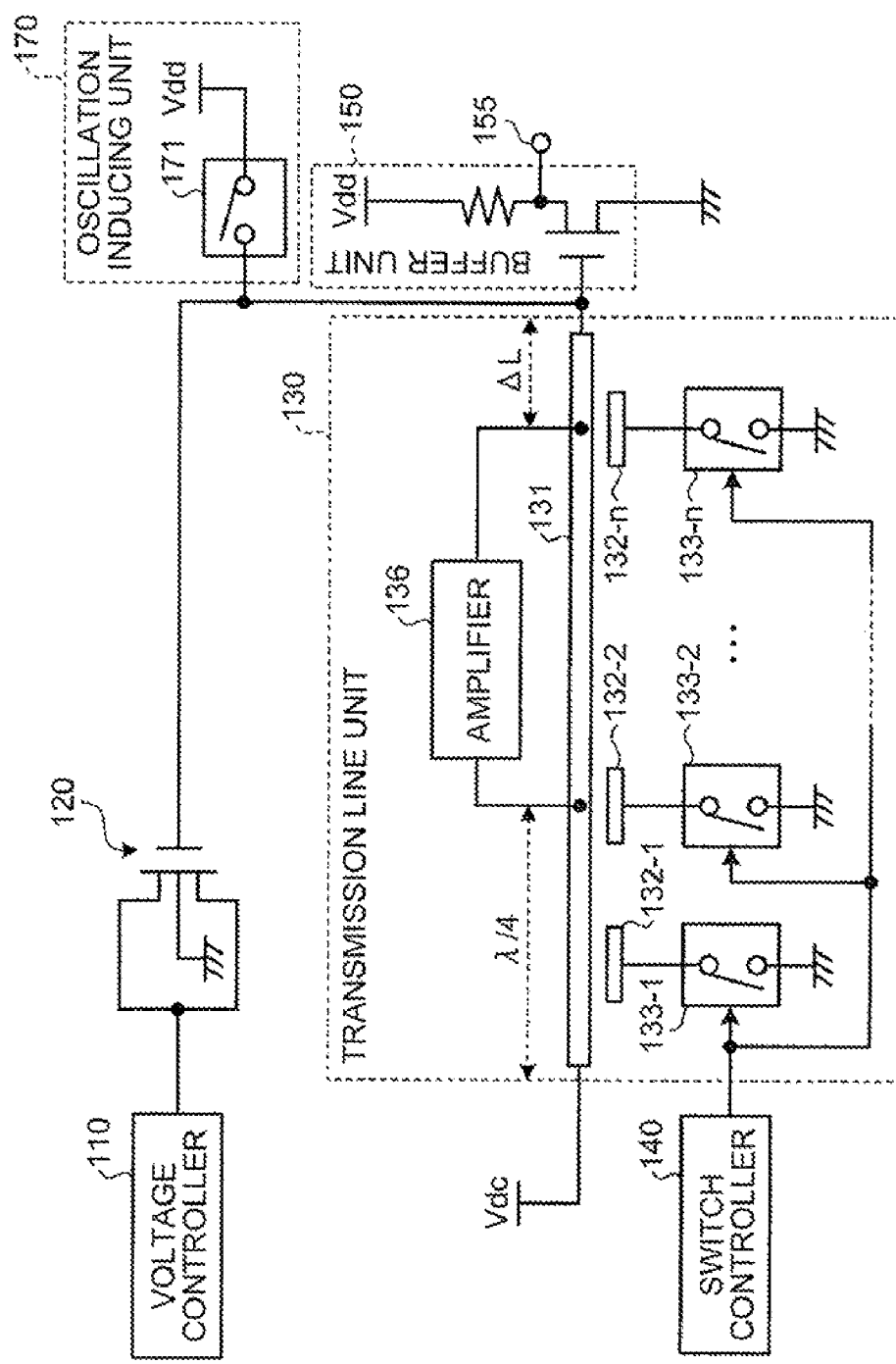

FIG.17

| NUMBER OF CONNECTED SWITCHES | DELAY [ps] | CHANGE IN EFFECTIVE PERMITTIVITY [%] | CHANGE IN FREQUENCY (25 GHz) | CHANGE IN FREQUENCY (40 GHz) |
|---|---|---|---|---|
| 0 | 8.9 | 0 | 0 | 0 |
| 5 | 9.3 | 7 | -1.8 GHz | -2.8 GHz |
| 11 | 9.6 | 14 | -3.6 GHz | -5.7 GHz |

FIG.28

| THIN FILM MATERIAL | FORMULA | MgO | SrBi$_2$Ta$_2$O$_9$ | ZrO$_2$ | HfO$_2$ | La$_2$O$_3$ | (C$_x$H$_y$O$_z$)$_n$ |
|---|---|---|---|---|---|---|---|
| | NAME | MAGNESIUM OXIDE | STRONTIUM BISMUTH TANTALATE | ZIRCONIUM OXIDE | HAFNIUM OXIDE | LANTHANUM OXIDE | LIQUID CRYSTAL POLYMER |
| | DIELECTRIC CONSTANT | 30 | 210-240 | 20-29 | 21-25 | 9 | 3 |

FIG.29

| FERRO-ELECTRIC MATERIAL | FORMULA | $Ti_3O_5$ | $SrBi_2Ta_2O_9$ | $Ba_{0.6}Sr_{0.4}TiO_3$ |
|---|---|---|---|---|
| | CHEMICAL NAME | TRITITANIUM PENTOXIDE | STRONTIUM BISMUTH TANTALATE | BARIUM STRONTIUM TITANATE |
| | DIELECTRIC CONSTANT | 29 | 210-240 | 290-305 |

OSCILLATOR AND PHASE SYNCHRONIZING CIRCUIT

CROSS-REFERENCE TO RELATED APPLICATION(S)

This application is based upon and claims the benefit of priority of the prior Japanese Patent Application No. 2009-144676, filed on Jun. 17, 2009, the entire contents of which are incorporated herein by reference.

FIELD

The embodiments discussed herein are directed to an oscillator and a phase synchronizing circuit.

BACKGROUND

In recent years, a technology for adjusting an oscillation frequency by an oscillator having an incorporated resonance circuit in a communication system, such as an optical communication system, has been known. According to this technology, a variable capacitative element, such as a capacitor or a diode, is provided in the resonance circuit to control the capacitance of the variable capacitative element. Thereby, a resonance frequency of the resonance circuit is adjusted, which results in changing a frequency (oscillation frequency) of a clock signal output from the oscillator. By using the oscillator, a clock signal having a high frequency of 20 GHz or more can be output, and a recent requirement for increasing a communication speed or apparatus performance can be met.

When a higher oscillation frequency is needed, an oscillator using a standing wave generated in a transmission path, such as a micro strip line, is used. In this oscillator, the length of the transmission path in the oscillator is determined based on an electrical length of the standing wave. That is, the length of the transmission path in the oscillator becomes ¼ of the electrical length of the oscillation frequency, which is the length where the standing wave is generated. If a voltage is applied to the transmission path, the standing wave is generated on the transmission path. Specifically, a standing wave where a traveling wave propagated to a terminating end of the transmission path and a reflected wave reflected on the terminating end of the transmission path are synthesized is generated. As a result, a clock signal that corresponds to the frequency of the standing wave generated in the transmission path is output from the oscillator. In the case of the oscillator using the standing wave, a variable capacitative element is connected to the terminating end of the transmission path, and the oscillation frequency of the oscillator is adjusted by controlling the capacitance of the variable capacitative element.

Such conventional technologies are disclosed in for example Japanese Laid-open Patent Publication Nos. 2008-118550 and 2005-217752, and Jri Lee et al., "A 75-GHz PLL in 90-nm CMOS Technology", ISSCC 2007/SESSION 23/BROADBAND RF AND RADAR/23.8, pp. 432-433.

In general, the oscillation frequency of the oscillator has a negative correlative relationship with the capacitance of the variable capacitative element. Specifically, if the capacitance of the variable capacitative element decreases, the oscillation frequency of the oscillator increases, and if the capacitance of the variable capacitative element increases, the oscillation frequency of the oscillator decreases. However, since a variable range of the capacitance of one variable capacitative element is restricted, it is considered to provide plural variable capacitative elements and increase the variable range of the capacitance to flexibly adjust the oscillation frequency of the oscillator over a wide band.

However, when the plural variable capacitative elements are provided, a parasitic capacitance of an entire circuit increases as the number of variable capacitative elements increases. As a result, even though the capacitance of each variable capacitative element is controlled to have a minimum value, the capacitance of the entire circuit is increased by only the parasitic capacitance due to the plural variable capacitive elements. For this reason, a sufficiently high oscillation frequency may not be obtained.

In regards to the oscillator using the standing wave, the oscillation frequency becomes a relatively high frequency, but the variable range of the capacitance of the variable capacitative element needs to be restricted to generate the standing wave which may be used in oscillation. That is, in the oscillator using the standing wave, a phase of the traveling wave at the terminating end of the transmission path is changed by controlling the capacitance of the variable capacitative element. However, if a standing wave where surrounding portions of the terminating end of the transmission path are used as antinodes is not generated, the oscillation frequency cannot be obtained. For this reason, in the oscillator using the standing wave, phases in the surrounding portions of the terminating end of the transmission path cannot be freely adjusted, and the capacitance of the variable capacitative element cannot be greatly changed. In the oscillator using the standing wave, it is difficult to flexibly adjust the oscillation frequency over a wide band, because of a restrictive condition due to the phases.

SUMMARY

According to an aspect of an embodiment of the invention, an oscillator includes a signal line that propagates a traveling wave according to application of a power supply voltage and has a length from a voltage applied portion where the power supply voltage is applied to at least one end is odd number times as long as the ¼ wavelength of the propagated traveling wave; a maintaining unit that maintains a standing wave generated in the signal line according to the traveling wave propagated by the signal line; an output unit that outputs a signal having an oscillation frequency using the standing wave maintained by the maintaining unit; a potential changing electrode that includes a facing portion, which faces the signal line in the vicinity of the signal line and of which the potential changes to the ground potential; and a controller that changes the potential of the facing portion included in the potential changing electrode and adjusts the oscillation frequency of the signal output from the output unit.

According to another aspect of an embodiment of the invention, an oscillator includes a signal line which propagates a traveling wave according to application of a power supply voltage and of which the length from a voltage applied portion where the power supply voltage is applied to at least one end is odd number times as long as the ¼ wavelength of the propagated traveling wave; a changing unit that changes effective permittivity corresponding to a propagation speed of the traveling wave in the signal line; and an output unit that outputs a signal having an oscillation frequency using the traveling wave propagated by the signal line, after the effective permittivity is changed by the changing unit.

According to still another aspect of an embodiment of the invention, a phase synchronizing circuit includes an oscillator that outputs a signal having an oscillation frequency according to an input voltage; and a comparator that compares the oscillation frequency of the signal output by the oscillator and a predetermined reference frequency and inputs an input voltage corresponding to a difference between the oscillation frequency and the reference frequency to the oscillator. The oscillator includes a signal line that propagates a traveling wave according to application of a power supply voltage and has a length from a voltage applied portion where the power supply voltage is applied to at least one end is odd number times as long as the ¼ wavelength of the propagated traveling wave; a potential changing electrode that includes a facing portion, which faces the signal line in the vicinity of the signal line and of which the potential changes to the ground potential; a controller that changes the potential of the facing portion included in the potential changing electrode according to the input voltage from the comparator; and an output unit that outputs a signal having an oscillation frequency using the traveling wave propagated by the signal line, after the potential of the facing portion is changed by the control signal from the control unit.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 1A is a diagram illustrating the configuration of an oscillator according to a first embodiment;

FIG. 17 is a diagram illustrating a specific example of a relationship between the number of connected switches and the change in frequency;

FIG. 28 is a table of formula and dielectric constants of several examples of thin film material; and FIG. 29 is a table of formula and dielectric constants of several examples of ferro-electric material.

DESCRIPTION OF EMBODIMENTS

Preferred embodiments of the present invention will be explained with reference to accompanying drawings. However, the exemplary embodiments are not limitative.

[a] First Embodiment

Configuration of an Oscillator

Figure 1B:
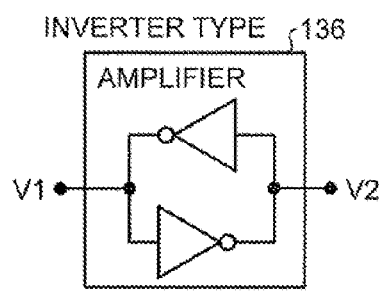
FIGS. 1B to 1E are diagrams illustrating examples of the configuration of an amplifier according to the first embodiment.
Figure 1C:
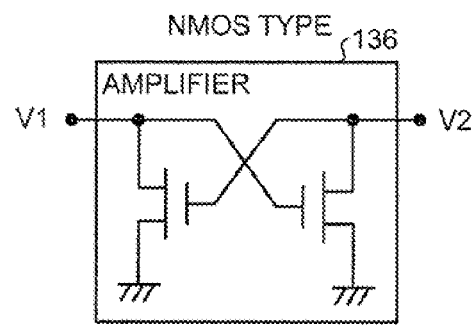
Figure 1D:
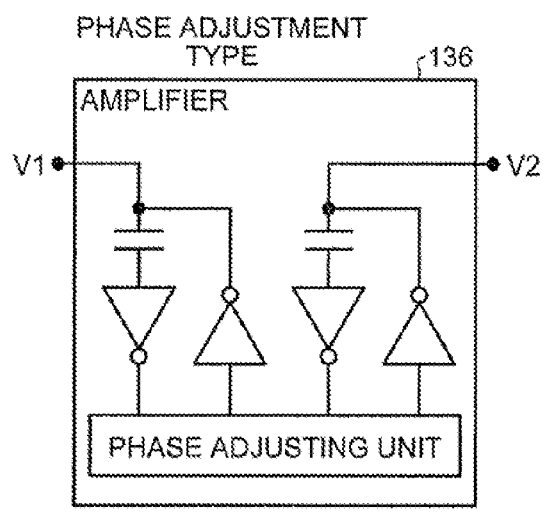
Figure 1E:
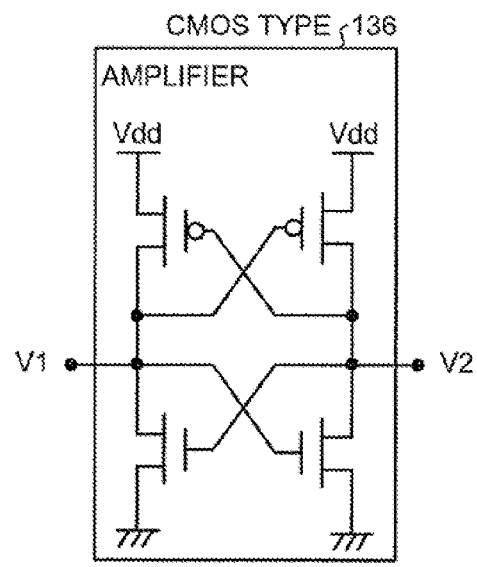

FIG. 1A illustrates the configuration of an oscillator according to a first embodiment. The oscillator illustrated in FIG. 1A has a voltage controller 110, a variable capacitative element 120, a transmission line unit 130, a switch controller 140, a buffer unit 150, an output terminal 155, and an oscillation inducing unit 170.

The voltage controller 110 controls a voltage that is applied to the variable capacitative element 120 and changes the capacitance of the variable capacitative element 120 with respect to a ground.

The variable capacitative element 120 is an element of which the capacitance changes according to a control voltage applied from the voltage controller 110. For example, as the variable capacitative element 120, a metal-oxide semiconductor field-effect transistor (MOSFET) is used. A board of the MOSFET is connected to a ground, a source and a drain thereof are connected to the voltage controller 110, and a gate thereof is connected to one end of a signal line 131 in the transmission line unit 130. A frequency of a standing wave that is generated in the transmission line unit 130 changes according to a change in the capacitance of the variable capacitive element 120. That is, if the capacitance of the variable capacitative element 120 changes, the phase shift amount in one end of the signal line 131 changes and the frequency of the standing wave changes. Specifically, if the capacitance of the variable capacitative element 120 increases, the frequency of the standing wave decreases, and if the capacitance of the variable capacitative element 120 decreases, the frequency of the standing wave increases.

In the first embodiment, only one MOSFET is provided as the variable capacitative element 120, and the parasitic capacitance that is generated in a circuit is minimally suppressed. Accordingly, the frequency of the standing wave can be prevented from decreasing due to the parasitic capacitance of the circuit. The variable range of the capacitance is narrow in one MOSFET. However, in the first embodiment, even though the capacitance of the variable capacitative element 120 does not change, an oscillation frequency can be flexibly adjusted. For this reason, in the first embodiment, the capacitance of the variable capacitative element 120 may be changed to a degree to which the oscillation frequency can be minutely adjusted, and the variable range does not need to be increased.

The transmission line unit 130 includes the signal line 131 that is connected to a power supply and a ground layer that is connected to the ground. In the transmission line unit 130, a dielectric layer that includes a mixture medium of $SiO_2$ and silicon is interposed between the signal line 131 and the ground layer. When a direct-current voltage Vdc is applied to the signal line 131, the transmission line unit 130 propagates a traveling wave and generates a standing wave. At this time, the transmission line unit 130 increases or decreases the appearance permittivity of the dielectric layer and changes a frequency of the standing wave over a wide band. Specifically, a frequency f of the standing wave is represented by the following Equation (1), using the light velocity c, the length L of the signal line 131, the phase shift amount ΔΦ in one end of the signal line 131, and the appearance permittivity Er in the transmission line unit 130.

$$f = \frac{c}{(4L/3)(1 + \Delta\Phi/2\pi)\sqrt{Er}} \quad (1)$$

In Equation (1), Er indicates the appearance permittivity in the transmission line unit 130, which is an effective permittivity corresponding to the speed of the traveling wave propagated by the transmission line unit 130. That is, since the material that is contained in the dielectric layer does not change, the specific permittivity of the dielectric layer that is determined from the unique permittivity of the material does not change. However, the effective permittivity Er corresponding to the propagation speed of the traveling wave can be changed, and the frequency f of the standing wave changes according to a change in the effective permittivity Er. As described above, in the first embodiment, since the variable range of the capacitance of the variable capacitative element 120 is narrow, the phase shift amount ΔΦ in one end of the signal line 131 cannot be greatly changed. However, if the effective permittivity Er in the transmission line unit 130 is mainly changed, the frequency f of the standing wave is adjusted. Specifically, the transmission line unit 130 has the signal line 131, strips 132-1 to 132-$n$ ($n$ is an integer of 1 or more), switches 133-1 to 133-$n$, and an amplifier 136.

The signal line 131 is a transmission path of which one end is connected to a power supply to supply a direct-current voltage Vdc and the other end is connected to the variable capacitative element 120 and the buffer unit 150. In the description below, one end of the signal line 131 that is connected to the power supply is referred to as a "starting end" and the other end of the signal line 131 that is connected to the variable capacitative element 120 and the buffer unit 150 is referred to as a "terminating end". The length of the signal line 131 from the starting end to the terminating end is ¾ of the wavelength of the traveling wave used in oscillation. For this reason, if the direct-current voltage Vdc is applied from the power supply, the signal line 131 generates a standing wave having the ¾ wavelength, in which the starting end where the direct-current voltage Vdc is applied is used as a node and the terminating end is used as an antinode. At this time, the frequency f of the standing wave that is generated by the signal line 131 is inversely proportional to a square root of the effective permittivity Er in the transmission line unit 130, as illustrated in Equation (1). Accordingly, if the effective permittivity Er in the transmission line unit 130 increases, the frequency f of the standing wave decreases, and if the effective permittivity Er in the transmission line unit 130 decreases, the frequency f of the standing wave increases.

The dielectric layer that includes a mixture medium of $SiO_2$ and silicon is formed between the signal line 131 and the ground layer, and the strips 132-1 to 132-$n$ and the switches 133-1 to 133-$n$ are disposed in the dielectric layer. The mixture medium, the strips 132-1 to 132-$n$, and the switches 133-1 to 133-$n$ form the dielectric layer as a whole and change the effective permittivity Er in the transmission line unit 130. The specific configuration of the transmission line unit 130 will be described in detail below.

Each of the strips 132-1 to 132-$n$ is composed of an elongated plate-shaped electrode that is formed of a conductor, such as a metal, and are arranged in parallel along the signal line 131 such that the strips do not contact the signal line 131. The strips 132-1 to 132-$n$ are connected to the ground layer through the switches 133-1 to 133-$n$, respectively. Accordingly, if the switches 133-1 to 133-$n$ connect the strips 132-1 to 132-$n$ and the ground layer, the potential of the strips 132-1 to 132-$n$ that are disposed in the vicinity of the signal line 131 changes to the ground potential.

The switches 133-1 to 133-$n$ switch connection and non-connection of the strips 132-1 to 132-$n$ and the ground layer, respectively, under the control from the switch controller 140. As the switches 133-1 to 133-$n$, for example, MOSFETs are used. If the switches 133-1 to 133-$n$ connect the strips 132-1 to 132-$n$ and the ground layer, the signal line 131 becomes pseudo close to the ground layer. That is, if the connection and the non-connection of the switches 133-1 to 133-$n$ are switched, the distance between the signal line 131 and the ground layer is pseudo adjusted. Even though the material forming the dielectric layer between the signal line 131 and the ground layer does not change, the effective permittivity Er that corresponds to the propagation speed of the traveling wave can be changed.

Specifically, if the number of connected switches 133-1 to 133-$n$ increases, it can be assumed that the signal line 131 and the ground layer become close to each other. Since the propagation speed of the traveling wave becomes slow, it can be assumed that the effective permittivity Er in the transmission line unit 130 increases. If the number of connected switches 133-1 to 133-$n$ decreases, it can be assumed that the signal line 131 and the ground layer become away from each other. Since the propagation speed of the traveling wave becomes fast, it can be assumed that the effective permittivity Er in the transmission line unit 130 decreases. As illustrated in Equation (1), if the effective permittivity Er in the transmission line unit 130 changes, the frequency f of the standing wave also changes. That is, the effective permittivity Er can be changed by switching the connection and non-connection of the switches 133-1 to 133-n, and the frequency f of the standing wave that is generated in the signal line 131 can be adjusted.

The amplifier 136 maintains the standing wave that is generated in the signal line 131. That is, the amplifier 136 amplifies the standing wave that is generated in the signal line 131 and prevents attenuation, and maintains oscillation in the signal line 131. Specifically, the amplifier 136 is connected to the position of the ¼ wavelength from the starting end of the signal line 131 and the position of the predetermined distance ΔL from the terminating end of the signal line 131, and causes the amplitudes of the standing waves at the two connection positions to have the same magnitudes to be inverted to each other. Essentially, the amplifier 136 associates the amplitudes at the position of the ¼ wavelength from the starting end of the signal line 131 and the position of the terminating end of the signal line 131 where the antinodes of the standing waves are formed. However, since the delay is generated until the amplitude at the connection position of the amplifier 136 arrives at the amplifier 136, in the first embodiment, the delay is compensated for by shifting the connection position of the amplifier 136 by the predetermined distance ΔL from the terminating end of the signal line 131. Thereby, the amplitudes of the standing waves at the position of the ¼ wavelength from the starting end of the signal line 131 and the amplitude of the standing wave at the position of the terminating end of the signal line 131 always have the same magnitudes to be inverted to each other, respectively.

The connection position of the amplifier 136 is not limited to the example of FIG. 1A, and the arbitrary connection position may be used, as long as the arbitrary connection position is the connection position that considers the delay generated until the amplitude of the standing wave at the connection position arrives at the amplifier 136. For example, the signal line 131 may be curved such that the portion of the ¼ wavelength from the starting end of the signal line 131 and the terminating end of the signal line 131 come close to each other, and the two points which are close to each other may be set to the connection positions of the amplifier 136, thereby negligibly decreasing the delay generated until the amplitude of the standing wave arrives at the amplifier 136.

Examples of the specific configuration of the amplifier 136 are illustrated in FIG. 1B to 1E. Types of the amplifier 136 include an inverter type where two inverters are combined, a phase adjustment type where a phase of an input voltage is adjusted, an NMOS (Negative-channel Metal Oxide Semiconductor) type where two NMOS inverters are combined, and a CMOS (Complementary Metal Oxide Semiconductor) type where two CMOS inverters are combined. The amplifier 136 illustrated in FIGS. 1B to 1E inputs voltages V1 and V2 of the signal line 131 at all of the connection positions as inputs and maintains the oscillation in state where phases of the voltages V1 and V2 are opposite to each other.

The switch controller 140 controls switching of the connection and non-connection of each of the switches 133-1 to 133-n. Specifically, when the oscillation frequency of the oscillator is increased, the switch controller 140 decreases the number of connected switches 133-1 to 133-n. When the oscillation frequency of the oscillator is decreased, the switch controller 140 increases the number of connected switches 133-1 to 133-n.

The buffer unit 150 has a buffering circuit, and excludes an influence from the side of the output terminal 155 with respect to the circuit such as the variable capacitative element 120 and the transmission line unit 130 and stably operates the circuit including the variable capacitative element 120 and the transmission line unit 130. Specifically, the buffer unit 150 includes a MOSFET, and a gate of the MOSFET is connected to the terminating end of the transmission line unit 130, a source thereof is connected to a power supply supplying a power supply voltage Vdd through a resistor element, and a drain thereof is connected to a ground. For this reason, if the standing wave having the frequency f is generated in the transmission line unit 130, the source and the drain become a conductive state with a cycle corresponding to the frequency f, and the buffer unit 150 outputs a clock signal having the frequency f to the output terminal 155.

When the oscillator starts, the oscillation inducing unit 170 discharge electricity to the transmission line unit 130 and induces a traveling wave in the signal line 131. Specifically, the oscillation inducing unit 170 has a switch 171 that is provided between a terminal of the power supply voltage Vdd and the terminating end of the signal line 131. When the oscillator starts, the switch 171 temporarily connects the terminal of the power supply voltage Vdd and the terminating end of the signal line 131 and induces a traveling wave in the signal line 131. The time when the switch 171 is closed and the terminal of the power supply voltage Vdd and the terminating end of the signal line 131 are connected to each other is determined according to the capacitance of the variable capacitative element 120.

Configuration of the Transmission Line Unit

Figure 2:
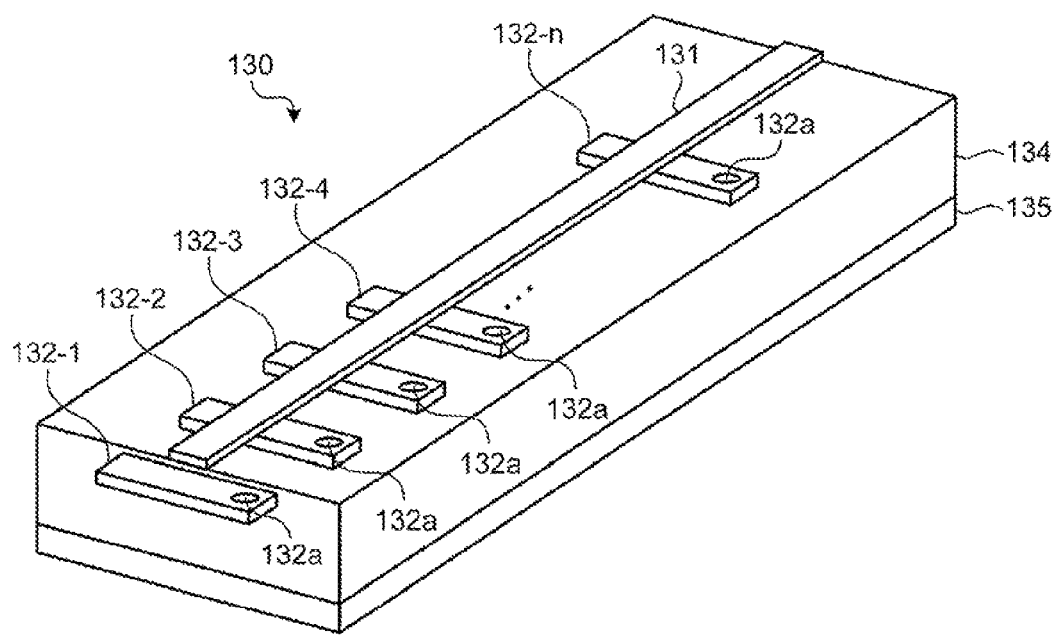
FIG. 2 is a schematic perspective view illustrating the configuration of a transmission line unit according to the first embodiment.

FIG. 2 is a perspective view illustrating the configuration of the transmission line unit 130 according to the first embodiment. As illustrated in FIG. 2, the transmission line unit 130 is configured by interposing a dielectric layer 134 between the signal line 131 and a ground layer 135, and the strips 132-1 to 132-n and the switches 133-1 to 133-n (not illustrated) are provided in the dielectric layer 134. The dielectric layer 134 is mainly formed of a mixture medium of $SiO_2$ and silicon, and has the configuration where the strips 132-1 to 132-n and the switches 133-1 to 133-n are fixed in the mixture medium. The dielectric layer 134 functions as one dielectric body as a whole. The ground layer 135 is connected to a ground and the potential thereof is always maintained at the ground potential.

The strips 132-1 to 132-n are disposed at an equivalent interval along the signal line 131 in the vicinity of the signal line 131. In FIG. 2, it is assumed that one end of the signal line 131 at the lower left of the figure is a starting end connected to the power supply applying the direct-current voltage Vdc and the other end of the signal line 131 at the upper right of the figure is a terminating end connected to the buffer unit 150. That is, it is assumed that a propagation direction of the traveling wave of the signal line 131 is a direction toward the strip 132-n from the strip 132-1. The strips 132-1 to 132-n are connected to switches 131-1 to 131-n through connection portions 132a, respectively.

Figure 3:
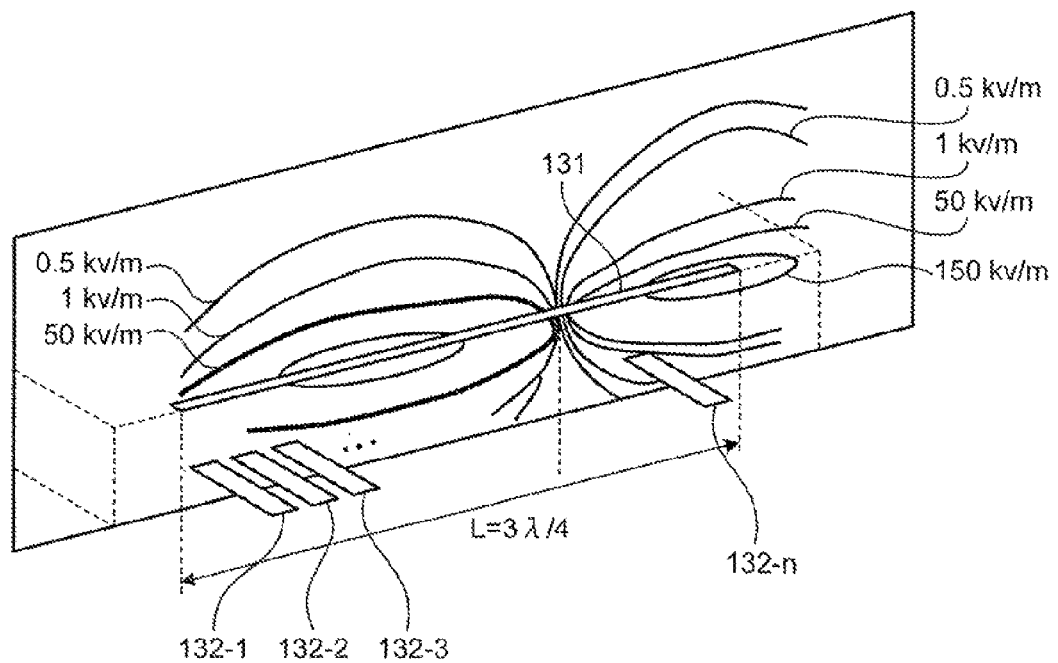
FIG. 3 is a diagram illustrating a specific example of strength of an electric field in the vicinity of a signal line.

In the transmission line unit 130 that has the above configuration, when the direct-current voltage Vdc is applied to the signal line 131 and a traveling wave whose wavelength λ is 2 mm and the frequency f is 52 GHz is propagated, a distribution of electric field strength in the vicinity of the signal line 131 is as illustrated in FIG. 3. That is, the electric field strength is distributed in a waveform-like shape corresponding to the ¾ wavelength based on the signal line 131. This waveform is a waveform of a standing wave where positions of the zero wavelength and the ½ wavelength from the end of the signal line 131 at the side of the strip 132-1 are used as nodes and positions of the ¼ wavelength and the ¾ wavelength from the end of the signal line 131 at the side of the strip 132-1 are used as antinodes. In the antinodes of the standing wave, the electric field strength becomes 150 kV/m or more. As such, if the length of the signal line 131 is set to ¾ of the wavelength λ, the standing wave is generated in the signal line 131.

Since the terminating end of the signal line 131 becomes the antinode of the standing wave and oscillates, the oscillator can output a clock signal having an oscillation frequency, using the standing wave. As illustrated in Equation (1), since the frequency f of the standing wave depends on the effective permittivity Er in the transmission line unit 130, the frequency f of the standing wave can be adjusted by changing the effective permittivity Er in the transmission line unit 130. As a result, even though the capacitance of the variable capacitative element 120 is not changed, the oscillation frequency of the oscillator can be changed.

Figure 4:
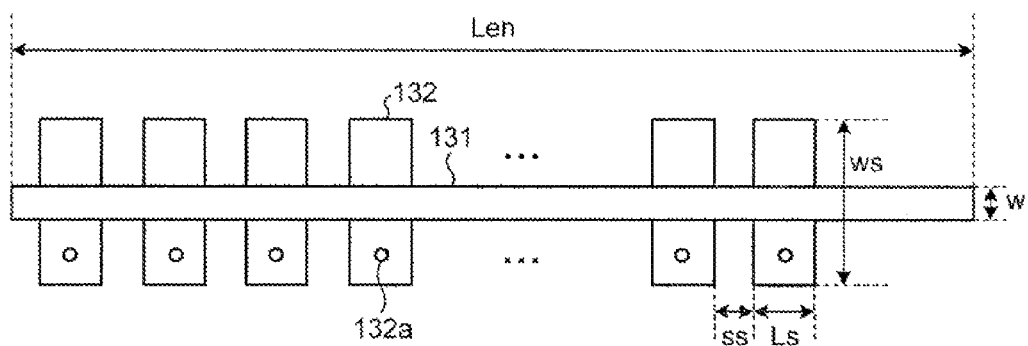
FIG. 4 is a schematic plan view illustrating the configuration of the transmission line unit according to the first embodiment.
Figure 5:
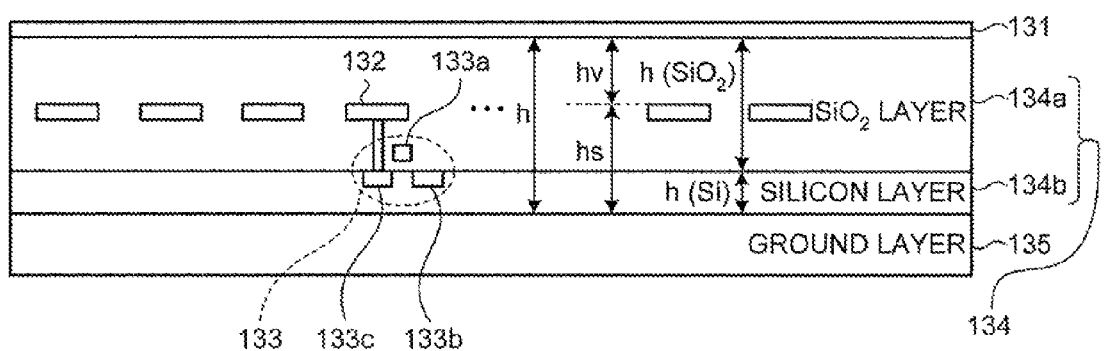
FIG. 5 is a schematic lateral view illustrating the configuration of the transmission line unit according to the first embodiment.

Next, the configuration of the transmission line unit 130 will be specifically described with reference to FIGS. 4 and 5. FIGS. 4 and 5 simply illustrate the strips 132-1 to 132-n and the switches 133-1 to 133-n as the strip 132 and the switch 133.

FIG. 4 is a schematic plan view illustrating the configuration of the transmission line unit 130 according to the first embodiment. As illustrated in FIG. 4, the transmission line unit 130 has the signal line 131 of which the length Len is 1.5 mm and the width w is 0.07 mm and plural strips 132 of which the transverse width Ls is 0.075 mm and the longitudinal width ws is 0.12 mm. The strips 132 face the signal line 131 and are arranged at equivalent intervals ss of 0.12 mm. In each strip 132, the connection portion 132a that is connected to the switch 133 is provided. The configuration illustrated in FIG. 4 is only an example of the specific configuration of the transmission line unit 130 according to the first embodiment, and dimensions of the signal line 131 and the strip 132 are not limited to dimensions illustrated in FIG. 4.

Since each strip 132 is disposed to face the signal line 131, the potential of each strip 132 becomes the ground potential, and the distance between the signal line 131 and the ground layer can be pseudo shortened. If the signal line 131 becomes close to the ground layer, it can be assumed that the effective permittivity Er in the transmission line unit 130 increases. As a result, a value of a denominator of the right side of Equation (1) increases and the frequency f of the standing wave that is generated in the signal line 131 decreases. Accordingly, if the number of strips 132 whose potential becomes the ground potential is increased or decreased, the frequency f of the standing wave can be adjusted and the oscillation frequency of the oscillator can be adjusted.

FIG. 5 is a schematic lateral view illustrating the configuration of the transmission line unit 130 according to the first embodiment. As illustrated in FIG. 5, the transmission line unit 130 has a layered structure, and the signal line 131, a $SiO_2$ layer 134a, a silicon layer 134b, and the ground layer 135 are formed from an upper side of the figure. The $SiO_2$ layer 134a and the silicon layer 134b form the dielectric layer 134.

The signal line 131 is formed on a surface of the transmission line unit 130, and the distance h from the ground layer 135 to the signal line 131 is 0.25 mm. The $SiO_2$ layer 134a is an insulating layer made of $SiO_2$ where the strips 132 are fixed, and the distance hs from the ground layer 135 to the strip 132 is 0.1 mm. Accordingly, the distance hv from the strip 132 to the signal line 131 becomes 0.15 mm. The $SiO_2$ layer 134a also includes a gate 133a of a MOSFET to form the switch 133. The gate 133a is connected to the switch controller 140.

The silicon layer 134b is a semiconductor layer that includes a source 133b and a drain 133c of the MOSFET to form the switch 133. Although not illustrated in FIG. 5, the source 133b of the switch 133 is connected to the ground layer 135. The drain 133c of the switch 133 is connected to the strip 132. When the transmission line unit 130 has a layered structure illustrated in FIG. 5, the transmission line unit 130 can be formed using a standard CMOS process and the oscillator can be easily manufactured.

The material $SiO_2$ constituting the $SiO_2$ layer 134a and the silicon constituting the silicon layer 134b are materials that have the fixed specific permittivity. Accordingly, if the specific permittivity of $SiO_2$ is defined as $\in r\ (SiO_2)$ and the specific permittivity of the silicon is defined as $\in r\ (Si)$ and the height of the $SiO_2$ layer 134a is defined as $h\ (SiO_2)$ and the height of the silicon layer 134b is defined as $h\ (Si)$ as illustrated in FIG. 5, the specific permittivity $\in r$ of the dielectric layer 134 is represented by the following Equation (2).

$$\varepsilon r = \frac{\varepsilon r(SiO_2) \cdot h(SiO_2) + \varepsilon r(Si) \cdot h(Si)}{h(SiO_2) + h(Si)} \quad (2)$$

The effective permittivity Er in the transmission line unit 130 is represented by the following Equation (3), using the total number n of switches 133, the number k of connected switches 133, the specific permittivity $\in r$ of the dielectric layer 134, the distance h between the signal line 131 and the ground layer 135, and the distance hv between the signal line 131 and the strip 132. However, each of A and B is a constant that is determined according to the specific permittivity $\in r$ of the dielectric layer 134.

$$Er = \begin{cases} \frac{\varepsilon r+1}{2} + \frac{\varepsilon r-1}{2}\left(\frac{1}{\sqrt{1+(A \cdot z/w)}} + B(1-(w/z)^2)\right), \\ \quad \text{if } (w/z) \leq 1 \\ \frac{\varepsilon r+1}{2} + \frac{\varepsilon r-1}{2}\left(\frac{1}{\sqrt{1+(A \cdot z/w)}}\right), \\ \quad \text{if } (w/z) > 1 \end{cases} \quad (3)$$

where $z = \frac{k}{n}hv + \frac{n-k}{n}h$.

As can be seen from Equation (3), even when a ratio between the width w of the signal line 131 and a variable z is not more than 1 or more than 1, if the variable z increases, the effective permittivity Er decreases. The variable z indicates the effective distance between the signal line 131 and the ground layer 135 according to the number of connected switches 133. If the number of connected switches 133 decreases, the variable z increases. Accordingly, if the number of connected switches 133 is reduced from Equation (3), it can be confirmed that the effective permittivity Er decreases. If the effective permittivity Er decreases, the frequency f of the standing wave that is generated in the transmission line unit 130 increases.

As such, the transmission line unit 130 according to the first embodiment switches connection and non-connection of the switches 133, increases and decreases the number of connected switches 133, changes the effective permittivity Er, and may adjust the frequency f of the standing wave. As a result, even though the variable range of the variable capacitative element 120 is narrow, the oscillation frequency that is output from the buffer unit 150 to the output terminal 155 can be flexibly adjusted over a wide band.

Configuration of the Switch

Figure 6:
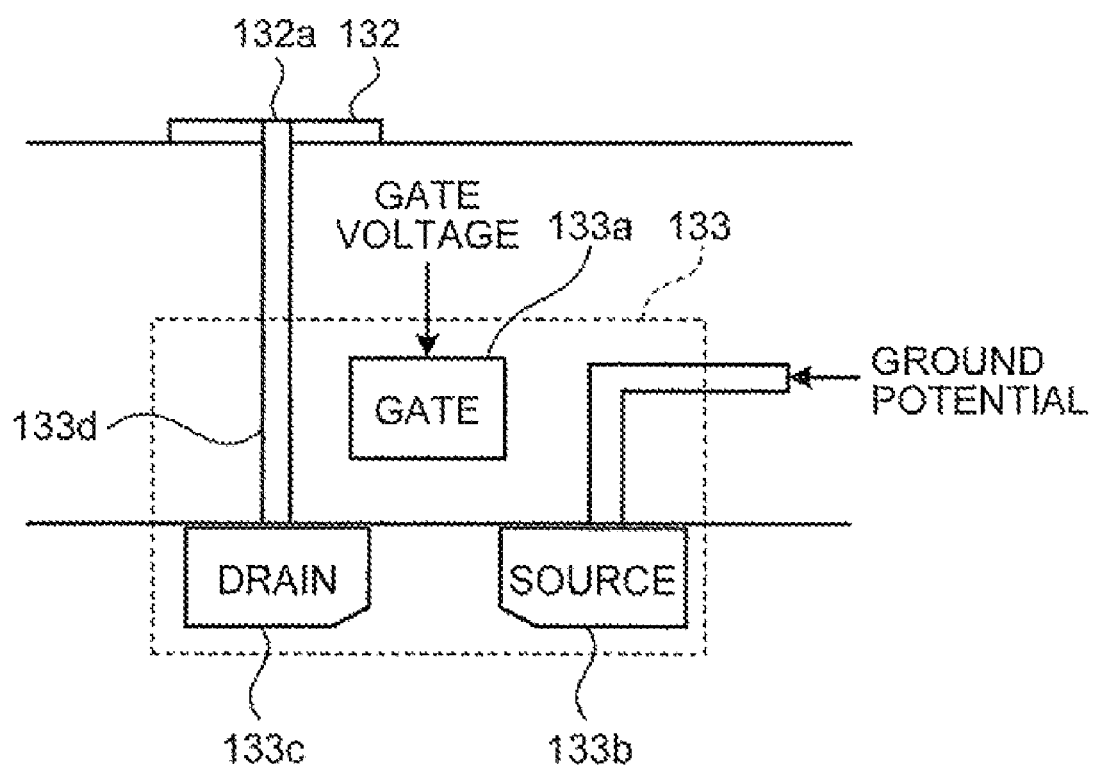
FIG. 6 is a diagram illustrating an example of the configuration of a switch according to the first embodiment.

FIG. 6 illustrates an example of the configuration of the switch 133 according to the first embodiment. The switch 133 illustrated in FIG. 6 has the gate 133a, the source 133b, the drain 133c, and a via 133d. As described above, the gate 133a is connected to the switch controller 140. If a gate voltage is applied from the switch controller 140, the gate 133a causes the source 133b and the drain 133c to become a conductive state. That is, if the gate voltage is applied, the gate 133a causes the switch 133 to become a connection state and causes the potential of the drain 133c to be matched with the potential of the source 133b. While the gate voltage is not applied from the switch controller 140, the gate 133a causes the switch 133 to become a non-connection state and does not cause the potential of the drain 133c to be matched with the potential of the source 133b.

The source 133b is connected to the ground layer 135, and transmits the ground potential to the drain 133c when the switch 133 is in a connection state. The drain 133c is connected to the strip 132 through the via 133d, and the potential thereof becomes the ground potential when the switch 133 is in a connection state. The via 133d causes the drain 133c and the connection portion 132a of the strip 132 to be connected, and causes the potential of the strip 132 to be matched with the ground potential of the drain 133c when the switch 133 is in a connection state.

In the switch 133 that has the above configuration, if the gate voltage is applied from the switch controller 140 to the gate 133a, the source 133b and the drain 133c becomes a conductive state and the potential of the strip 132 that is connected to the drain 133c becomes the ground potential. That is, if the switch 133 becomes a connection state by the control from the switch controller 140, the potential of each of the ground layer 135, the source 133b, the drain 133c, the via 133d, and the strip 132 becomes the ground potential, and the distance between the signal line 131 and the ground layer 135 becomes pseudo shortened. Thereby, the effective permittivity Er in the transmission line unit 130 changes and the frequency f of the standing wave that is generated in the transmission line unit 130 is adjusted.

Operation of the Oscillator

Next, the operation of the oscillator having the transmission line unit 130 configured in the above way will be described. If the direct-current voltage Vdc is applied from the power supply to the starting end of the signal line 131, the standing wave having the frequency f according to the capacitance of the variable capacitative element 120 and the effective permittivity Er in the transmission line unit 130 is generated in the signal line 131. At this time, the effective permittivity Er in the transmission line unit 130 is adjusted by switching the connection and non-connection of the switches 133-1 to 133-n by the switch controller 140.

Specifically, the potential of the strips 132-1 to 132-n that correspond to the switches 133-1 to 133-n becoming a connection state by the switch controller 140 becomes the ground potential. For this reason, if the number of connected switches 133-1 to 133-n increases, the signal line 131 and the ground layer 135 become pseudo close to each other. As a result, the propagation speed of the traveling wave that is propagated along the signal line 131 by application of the direct-current voltage Vdc decreases, it can be assumed that the effective permittivity Er increases, and the frequency f of the standing wave decreases.

In contrast, if the number of connected switches 133-1 to 133-n decreases, the signal line 131 and the ground layer 135 become pseudo far away from each other. As a result, the propagation speed of the traveling wave that is propagated along the signal line 131 by application of the direct-current voltage Vdc increases, it can be assumed that the effective permittivity Er decreases, and the frequency f of the standing wave increases.

The capacitance of the variable capacitative element 120 is adjusted by a control voltage applied from the voltage controller 110 to the variable capacitative element 120. In the first embodiment, however, the variable range of the capacitance of the variable capacitative element 120 is narrow, and only minute adjustment of the frequency f of the standing wave is performed by minutely changing the phase shift amount ΔΦ. As such, even though the variable range of the capacitance of the variable capacitative element 120 is narrow, since the variable range of the effective permittivity Er in the transmission line unit 130 is wide in the first embodiment, a control range of the frequency f can be widened.

As described above, since the standing wave where the frequency f is adjusted has an antinode at the terminating end of the signal line 131 connected to the buffer unit 150, a clock signal that corresponds to the frequency f of the standing wave is output to the output terminal 155 by the buffer unit 150.

Switching Operation of the Switch

Figure 7:
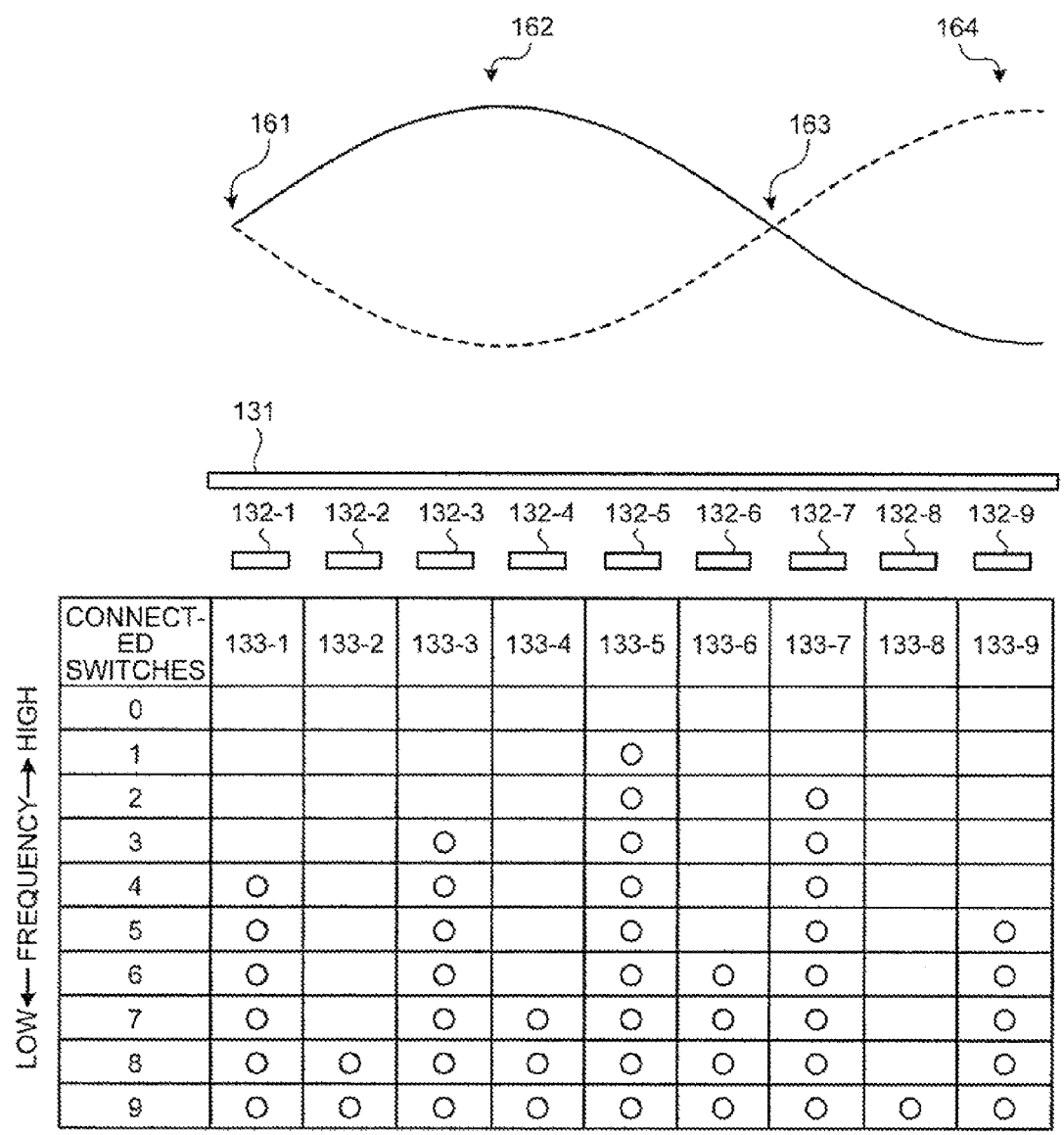
FIG. 7 is a diagram illustrating a specific example of a switching operation according to the first embodiment.

Next, a specific example of the switching operation of the switch 133 according to the first embodiment will be described. FIG. 7 illustrates a specific example of the switching operation of switches 133-1 to 133-9 when nine strips 132-1 to 132-9 are arranged with respect to the signal line 131. In FIG. 7, an upper part illustrates a waveform of the standing wave that is generated in the signal line 131 and a lower part illustrates the switches 133-1 to 133-9 that become a connection state according to the magnitude of the frequency f. That is, if the switches 133-1 to 133-9 that are illustrated by circles ("O") in FIG. 7 are made to become a connection state, the potential of the corresponding strips 132-1 to 132-9 becomes the ground potential and the magnitude of the frequency f of the standing wave changes.

Specifically, if the number of connected switches decreases, the frequency f of the standing wave increases, and if the number of connected switches increases, the frequency f of the standing wave decreases. FIG. 7 illustrates the case where the connection and non-connection of the switches 133-1 to 133-9 are switched such that the connected switches are equally disposed. For example, when only one switch is made to become a connection state, the switch 133-5 that corresponds to the strip 132-5 disposed at the center becomes a connection state and the remaining eight switches become a non-connection state.

When the two switches are made to become a connection state, the switch 133-5 and the switch 133-7 become a connection state and the remaining seven switches become a non-connection state. In this case, the switch 133-7 is selected as the second switch because the strip 132-7 is disposed in the vicinity of a node 163 of the standing wave. That is, when the potential of the strips (for example, strips 132-4 and 132-9) that are disposed at the antinodes of the standing wave becomes the ground potential, the relatively large parasitic capacitance is generated and energy loss is generated. Meanwhile, when the potential of the strips (for example, strips 132-1 and 132-7) that are disposed at the nodes of the standing wave becomes the ground potential, the parasitic capacitance can be prevented from being generated. For this reason, when the switches are connected, if the switches becoming a connection state are not equally disposed, the switches becoming a connection state are determined in consideration of the waveform of the standing wave.

When the three switches are made to become a connection state, the switches 133-5, 133-7, and 133-3 become a connection state and the remaining six switches become a non-connection state. The strip 132-3 is relatively close to an antinode 162 of the standing wave. However, at a stage where the two switches are made to become a connection state, since the switch 133-7 has become a connection state, the switch 133-3 that is disposed at the position symmetrical to the position of the switch 133-7 becomes a connection state.

As such, if the switches 133-1 to 133-9 are switched such that the connected switches are equally disposed, the entire signal line 131 becomes equally close to the ground layer 135. For this reason, the frequency f of the standing wave that is generated in the signal line 131 can be accurately adjusted by securely changing the effective permittivity Er of the signal line 131.

Similar to the above examples, when the four switches are made to become a connection state, the switch 133-1 that corresponds to the strip 132-1 close to a node 161 of the standing wave newly becomes a connection state. When the five switches are made to become a connection state, the switch 133-9 that is disposed at the position symmetrical to the position of the switch 133-1 which is already connected becomes a connection state. When the six switches are made to become a connection state, the switch 133-6 that corresponds to the strip 132-6 close to the node 163 of the standing wave becomes a connection state.

In FIG. 7, when the number of connected switches increases, the connected switches are made to continuously become a connection state. However, when the number of connected switches changes, which switch is made to become a connection state may be arbitrarily determined. For example, when the number of connected switches increases from 1 to 2, a state of the switch 133-5 which is already connected may be switched to a non-connection state and states of the switches 133-3 and 133-7 may be then switched to connection states. In this way, the connected switches can always be equally disposed. Instead of equality of the arrangement of the connected switches, a sequence may be considered. For example, the switches may become a connection state sequentially from the switches corresponding to the strips close to the nodes 161 and 163 of the standing wave.

Figure 8:
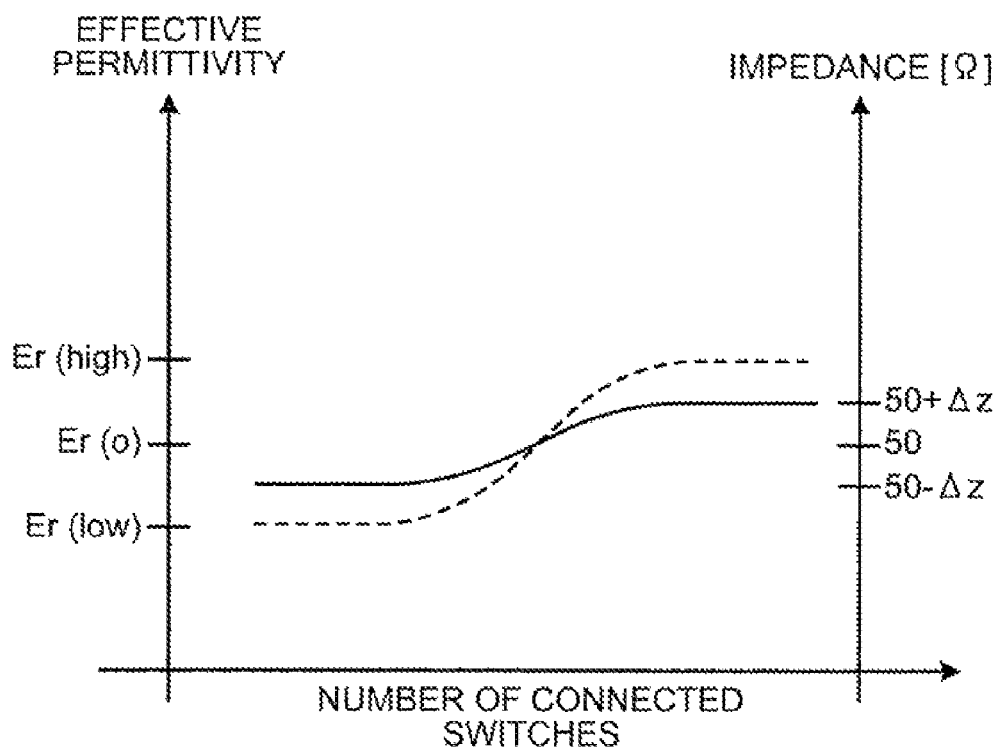
FIG. 8 is a diagram illustrating a specific example of a change in effective permittivity and impedance.

As such, if the switch 133 is switched and the number of switches 133 in a connection state is changed, as illustrated by a solid line of FIG. 8, impedance of the signal line 131 increases or decreases in a range of variance $\Delta z$ based on 50Ω. Likewise, as illustrated by a broken line of FIG. 8, the effective permittivity Er in the transmission line unit 130 changes from a minimum value Er (low) to a maximum value Er (high). Accordingly, if a frequency fo corresponding to the effective permittivity Er(o) of when the switches 133 whose number is half the existing number of switches become a connection state is set as a central frequency, the frequency f of the standing wave can be adjusted according to a change in the effective permittivity Er due to an increase and decrease in the number of connected switches 133.

Figure 9:
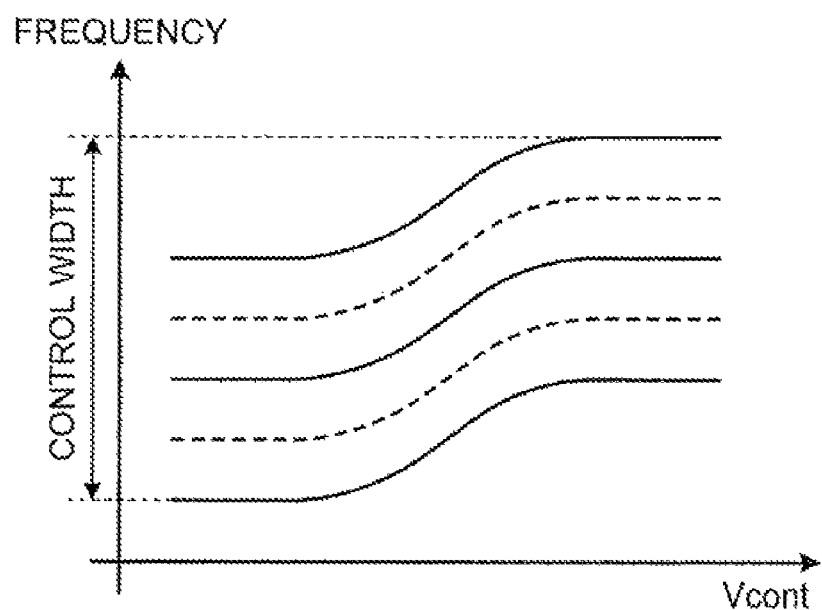
FIG. 9 is a diagram illustrating a specific example of a control width of a frequency.

In the first embodiment, the capacitance of the variable capacitative element 120 may also change. For this reason, if a control voltage Vcont that is applied from the voltage controller 110 to the variable capacitative element 120 is changed, the frequency f of the standing wave can be minutely adjusted, even though the number of connected switches 133 is fixed. For example, as illustrated in FIG. 9, if the control voltage Vcont increases, the frequency f of the standing wave increases, even though the number of connected switches 133 does not change. In FIG. 9, plural curved lines illustrate changes in the frequency f when the number of connected switches 133 is different, and the lower curved lines of the figure illustrate changes in the frequency f when the number of connected switches 133 is large. Accordingly, if the switches 133 are switched and the control voltage Vcont is changed, the frequency f of the standing wave can be adjusted with the wide control width illustrated in FIG. 9.

As such, according to the first embodiment, the strips that are connected to the ground layer through the switches are disposed in the vicinity of the signal line, and the signal line and the ground layer are made to become pseudo close to or away from each other by switching the connection and non-connection of the switches. Thereby, the effective permittivity that corresponds to the propagation speed of the traveling wave propagated along the signal line changes. As a result, the frequency of the standing wave that is generated in the signal line can be changed, and the oscillation frequency of the oscillator can be flexibly adjusted over a wide band. Since the plural capacitative elements are not needed to adjust the oscillation frequency, the parasitic capacitance can be prevented from being generated, and a clock signal having an oscillation frequency of a sufficiently high frequency band can be output.

Figure 10:
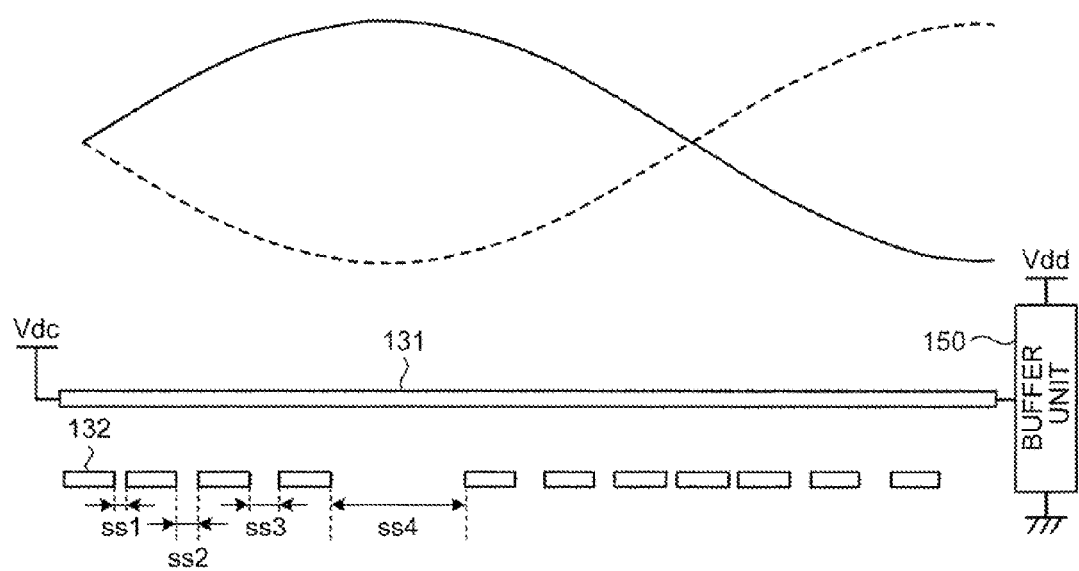
FIG. 10 is a diagram illustrating another example of arrangements of strips.

In the first embodiment, the plural strips 132 are arranged along the signal line 131 at an equivalent interval, but the arrangement of the strips 132 is not limited thereto. For example, as illustrated in FIG. 10, intervals between the plural strips 132 may not be equal. FIG. 10 illustrates the configuration where plural strips 132 are disposed to be closer to a node of the standing wave generated in the signal line 131 than an antinode thereof. That is, in the sequence close to the node of the standing wave, intervals ss1, ss2, ss3, and ss4 between the strips 132 satisfy a relationship of the following Equation (4).

$$ss1 < ss2 < ss3 < ss4 \qquad (4)$$

In this way, generation of the parasitic capacitance in the antinode of the standing wave and generation of the energy loss due to the generation of the parasitic capacitance can be decreased, and the frequency f of the standing wave can be efficiently adjusted. Similarly, since the antinode of the standing wave is formed even in the terminating end of the signal line 131 that is connected to the buffer unit 150, the strips 132 may not be disposed in the vicinity of the terminating end of the signal line 131.

[b] Second Embodiment

In a second embodiment, semiconductor strips that have the functions of the strips and the switches in the first embodiment are disposed in the vicinity of the signal line, the effective permittivity of the signal line is changed, and the oscillation frequency is flexibly adjusted.

Since the configuration of the oscillator according to the second embodiment is almost the same as the configuration (refer to FIG. 1A) of the oscillator according to the first embodiment, the description is not repeated here. In the second embodiment, the configuration of the transmission line unit 130 is different from the configuration of the transmission line unit in the first embodiment.

Configuration of the Transmission Line Unit

Figure 11:
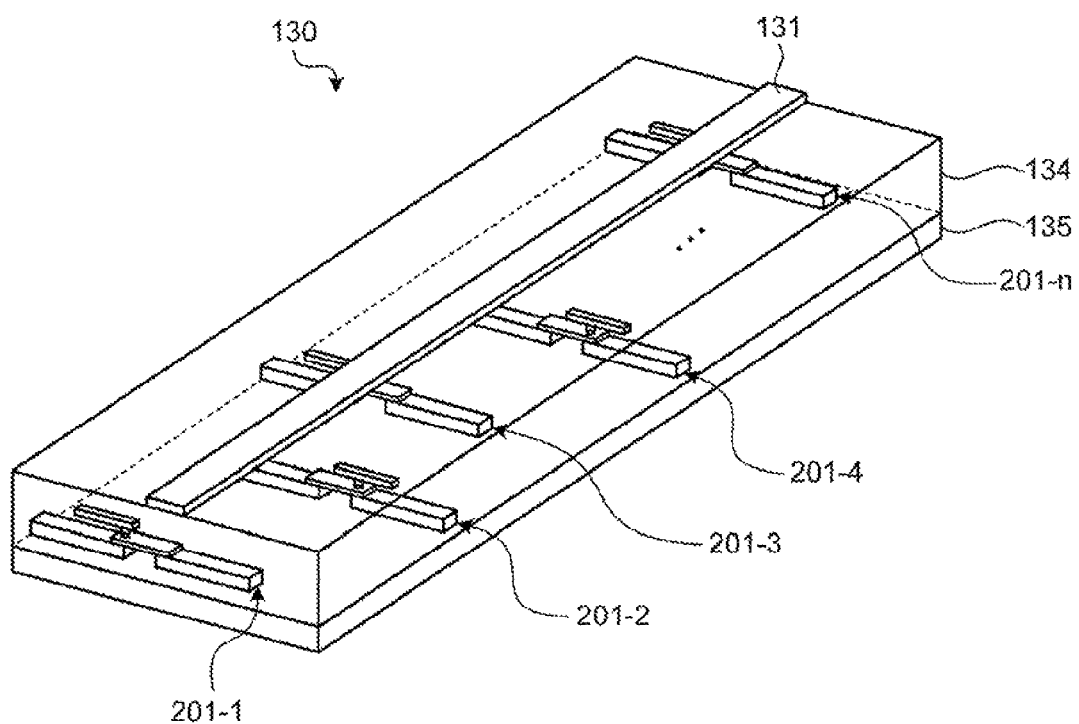
FIG. 11 is a schematic perspective view illustrating the configuration of a transmission line unit according to a second embodiment.

FIG. 11 is a perspective view illustrating the configuration of the transmission line unit 130 according to the second embodiment. In FIG. 11, the same components as those of FIG. 2 are denoted by the same reference numerals and the description thereof is not repeated here. As illustrated in FIG. 11, the transmission line unit 130 is configured by interposing the dielectric layer 134 between the signal line 131 and the ground layer 135, and semiconductor strips 201-1 to 201-n are provided in the dielectric layer 134.

The semiconductor strips 201-1 to 201-n are composed of semiconductors, such as MOSFETs, and are arranged along the signal line 131 such that the semiconductor strips do not contact the signal line 131. Specifically, a drain of each of the semiconductor strips 201-1 to 201-n faces the signal line 131 and a gate thereof is connected to the switch controller 140. Although not illustrated in FIG. 11, a source of each of the semiconductor strips 201-1 to 201-n is connected to the ground layer 135. Accordingly, if a gate voltage is applied from the switch controller 140 to the gate of each of the semiconductor strips 201-1 to 201-n, the potential of the drain that faces the signal line 131 becomes the ground potential. As such, it can be assumed that the semiconductor strips 201-1 to 201-n in the second embodiment are electrodes where the strips 132-1 to 132-n and the switches 133-1 to 133-n in the first embodiment are integrated with each other.

Figure 12:
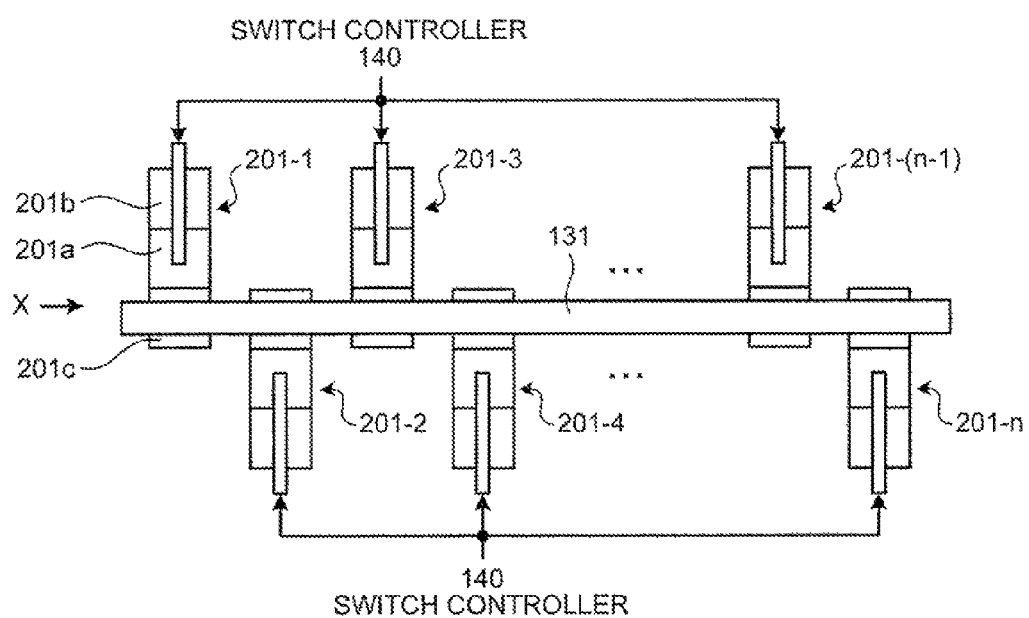
FIG. 12 is a schematic plan view illustrating the configuration of the transmission line unit according to the second embodiment.

FIG. 12 is a schematic plan view illustrating the configuration of the transmission line unit 130 according to the second embodiment. As illustrated in FIG. 12, the transmission line unit 130 has the signal line 131 and the semiconductor strips 201-1 to 201-n. Each of the semiconductor strips 201-1 to 201-n has a gate 201a, a source 201b, and a drain 201c. The drain 201c of each of the semiconductor strips 201-1 to 201-n faces the signal line 131 and the source 201b thereof is connected to the ground layer 135. The gate 201a is connected to the switch controller 140 and is applied with the gate voltage, if necessary. The configuration of the semiconductor strip 201-1 when viewed from an X direction of FIG. 12 will be described in detail below with reference to FIG. 14.

In the second embodiment, since the source 201b of each of the semiconductor strips 201-1 to 201-n is connected to the ground layer 135, the gate voltage is applied to the gate 201a and the source 201b and the drain 201c become a conductive state, and the potential of the drain 201c becomes the ground potential. Since the drain 201c faces the signal line 131, if the potential of the drain 201c becomes the ground potential, the distance between the signal line 131 and the ground layer 135 can be pseudo shortened. If the signal line 131 becomes close to the ground layer 135, it can be assumed that the effective permittivity Er in the transmission line unit 130 increases. As a result, the frequency f of the standing wave that is generated in the signal line 131 decreases. Accordingly, if the gate voltage is applied and the number of semiconductor strips 201-1 to 201-n becoming a conductive state is increased or decreased, the frequency f of the standing wave can be adjusted and the oscillation frequency of the oscillator can be adjusted.

Figure 13:
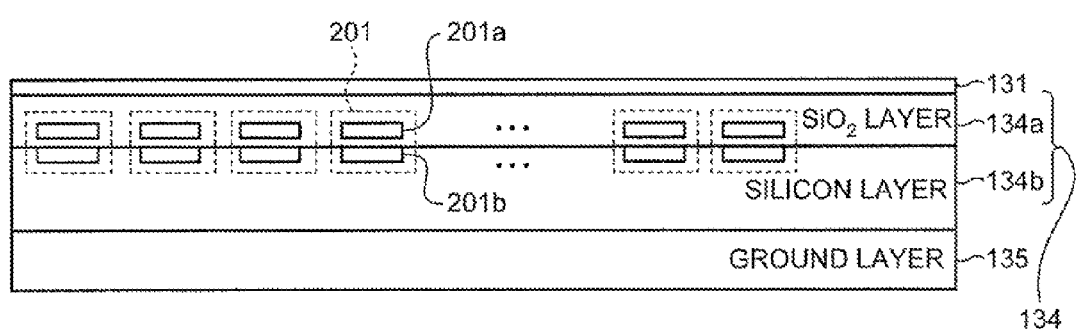
FIG. 13 is a schematic lateral view illustrating the configuration of the transmission line unit according to the second embodiment.

FIG. 13 is a schematic lateral view illustrating the configuration of the transmission line unit 130 according to the second embodiment. In FIG. 13, the same components as those of FIG. 5 are denoted by the same reference numerals and the description thereof is not repeated here. As illustrated in FIG. 13, the transmission line unit 130 has the same layered structure as that of FIG. 5, and the SiO$_2$ layer 134a includes the gate 201a of a semiconductor strip 201. The gate 201a is connected to the switch controller 140.

The silicon layer 134b is a semiconductor layer that includes the source 201b and the drain 201c of the semiconductor strip 201. Although not illustrated in FIG. 13, the source 201b of the semiconductor strip 201 is connected to the ground layer 135. The drain 201c that becomes a conductive state with the source 201b by applying the gate voltage to the gate 201a faces the signal line 131. As such, if the strips that are disposed in the vicinity of the signal line 131 are composed of the semiconductor strips 201, the effective permittivity Er can be changed even though the conductor strips are not disposed in the vicinity of the signal line 131, and the parasitic capacitance can be prevented from increasing due to the arrangement of the conductors in the vicinity of the signal line 131.

Figure 14:
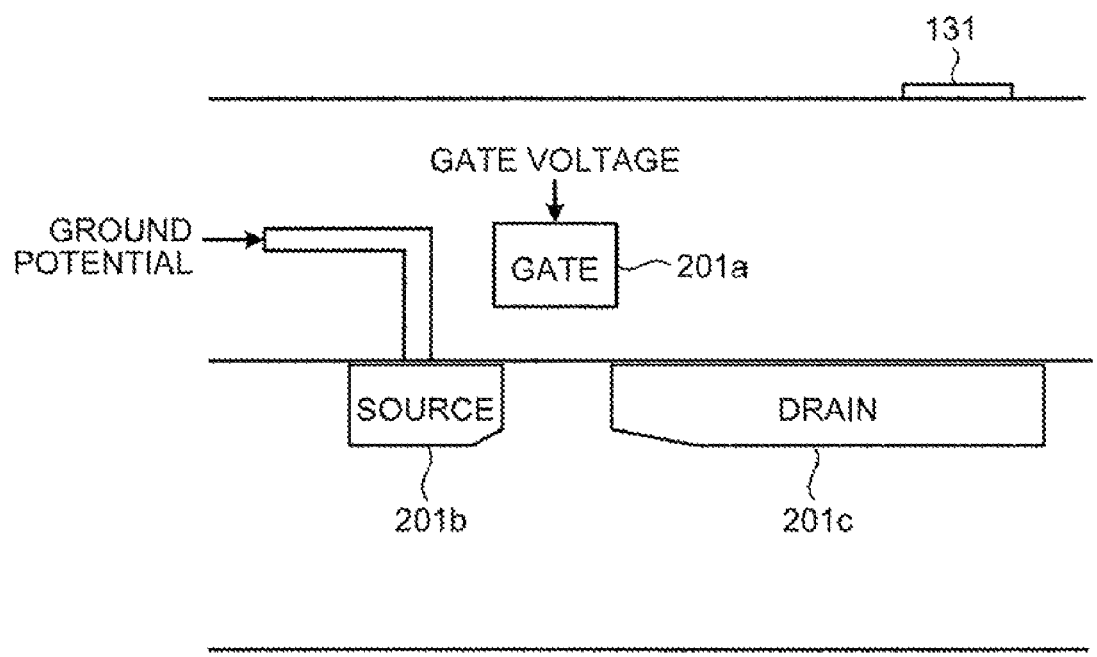
FIG. 14 is a diagram illustrating an example of the configuration of semiconductor strips according to the second embodiment.

FIG. 14 illustrates an example of the configuration of the semiconductor strip 201-1 when viewed from the X direction of FIG. 12. As illustrated above, the gate 201a is connected to the switch controller 140. If the gate voltage is applied from the switch controller 140 to the gate 201a, the gate 201a causes the source 201b and the drain 201c to become a conductive state. That is, if the gate voltage is applied to the gate 201a, the gate 201a causes the potential of the drain 201c to be matched with the potential of the source 201b.

The source 201b is connected to the ground layer 135. If the gate voltage is applied to the gate 201a, the source 201b transmits the ground potential to the drain 201c. The drain 201c extends long in a direction away from the source 201b, and an extended portion faces the signal line 131. When the gate voltage is applied to the gate 201a, the potential of the drain 201c becomes the ground potential. In the second embodiment, since the drain 201c is formed to extend longer than the source 201b, the gate 201a and the source 201b can be provided at positions away from the signal line 131, while the signal line 131 and the drain 201c are made to face each other. Thereby, the transmission line unit 130 that includes the signal line 131 and the semiconductor strip 201 can be easily manufactured. However, if the drain 201c faces the signal line 131, the drain 201c does not need to be formed in a shape different from a shape of the source 201b.

In the semiconductor strip 201 that is configured in the above way, if the gate voltage is applied from the switch controller 140 to the gate 201a, the source 201b and the drain 201c become a conductive state and the potential of the drain 201c becomes the ground potential. That is, if the semiconductor strip 201 becomes a conductive state by the control from the switch controller 140, the potential of each of the ground layer 135, the source 201b, and the drain 201c becomes the ground potential, and the distance between the signal line 131 and the ground layer 135 becomes pseudo shortened. Thereby, the effective permittivity Er in the transmission line unit 130 changes and the frequency f of the standing wave that is generated in the transmission line unit 130 is adjusted.

Operation of the Oscillator

Next, the operation of the oscillator having the transmission line unit 130 configured in the above way will be described. If the direct-current voltage Vdc is applied from the power supply to the starting end of the signal line 131, the standing wave having the frequency f according to the capacitance of the variable capacitative element 120 and the effective permittivity Er in the transmission line unit 130 is generated in the signal line 131. At this time, the effective permittivity Er in the transmission line unit 130 is adjusted by switching the conduction and non-conduction of the semiconductor strips 201-1 to 201-n by the switch controller 140.

Specifically, the potential of the drain 201c of each of the semiconductor strips 201-1 to 201-n that become a conductive state by the switch controller 140 becomes the ground potential. If the number of semiconductor strips 201-1 to 201-n becoming a conductive state increases, the signal line 131 and the ground layer 135 become pseudo close to each other. As a result, the propagation speed of the traveling wave that is propagated along the signal line 131 by application of the direct-current voltage Vdc decreases, it can be assumed that the effective permittivity Er increases, and the frequency f of the standing wave decreases.

In contrast, if the number of semiconductor strips 201-1 to 201-n becoming a conductive state decreases, the signal line 131 and the ground layer 135 become pseudo far away from each other. As a result, the propagation speed of the traveling wave that is propagated along the signal line 131 by application of the direct-current voltage Vdc increases, it can be assumed that the effective permittivity Er decreases, and the frequency f of the standing wave increases.

In the second embodiment, switching of the conduction and non-conduction of the semiconductor strips 201-1 to 201-n can be performed in the same sequence as switching of the connection and non-connection of the switches 133-1 to 133-n in the first embodiment. That is, in the sequence where the arrangement of the semiconductor strips in a conductive state is equalized, the switch controller 140 applies the gate voltage to the gate 201a of the semiconductor strips 201-1 to 201-n. At this time, the switch controller 140 applies the gate voltage preferentially to the gate 201a of each of the semiconductor strips close to the node of the standing wave.

The capacitance of the variable capacitative element 120 is adjusted by a control voltage applied from the voltage controller 110 to the variable capacitative element 120. In the second embodiment, however, the variable range of the capacitance of the variable capacitative element 120 is narrow, and only minute adjustment of the frequency f of the standing wave is performed by minutely changing the phase shift amount ΔΦ. As such, even though the variable range of the capacitance of the variable capacitative element 120 is narrow, since the variable range of the effective permittivity Er in the transmission line unit 130 is wide in the second embodiment, a control range of the frequency f can be widened.

As described above, since the waveform of the standing wave where the frequency f is adjusted has an antinode at the terminating end of the signal line 131 connected to the buffer unit 150, a clock signal that corresponds to the frequency f of the standing wave is output to the output terminal 155 by the buffer unit 150.

As such, according to the second embodiment, the semiconductor strips where the sources are connected to the ground layer are disposed such that the drains face the signal line, and the signal line and the ground layer are made to become pseudo close to or away from each other by switching the conduction and non-conduction of the semiconductor strips. Thereby, the effective permittivity that corresponds to the propagation speed of the traveling wave propagated along the signal line changes. As a result, the frequency of the standing wave that is generated in the signal line can be changed, and the oscillation frequency of the oscillator can be flexibly adjusted over a wide band. Since a lot of capacitative elements are not needed to adjust the oscillation frequency, the parasitic capacitance can be prevented from being generated, and a clock signal having an oscillation frequency of a sufficiently high frequency band can be output. Since the strips disposed in the vicinity of the signal line are not the conductors but the semiconductors, the parasitic capacitance can be prevented from increasing due to the arrangement of the conductors.

[c] Third Embodiment

In a third embodiment, in an oscillator that has two signal lines connected by a clamp circuit, the strips are disposed in the vicinity of each of the signal lines and a sufficiently high oscillation frequency can be flexibly adjusted over a wide band.

Configuration of the Oscillator

Figure 15:
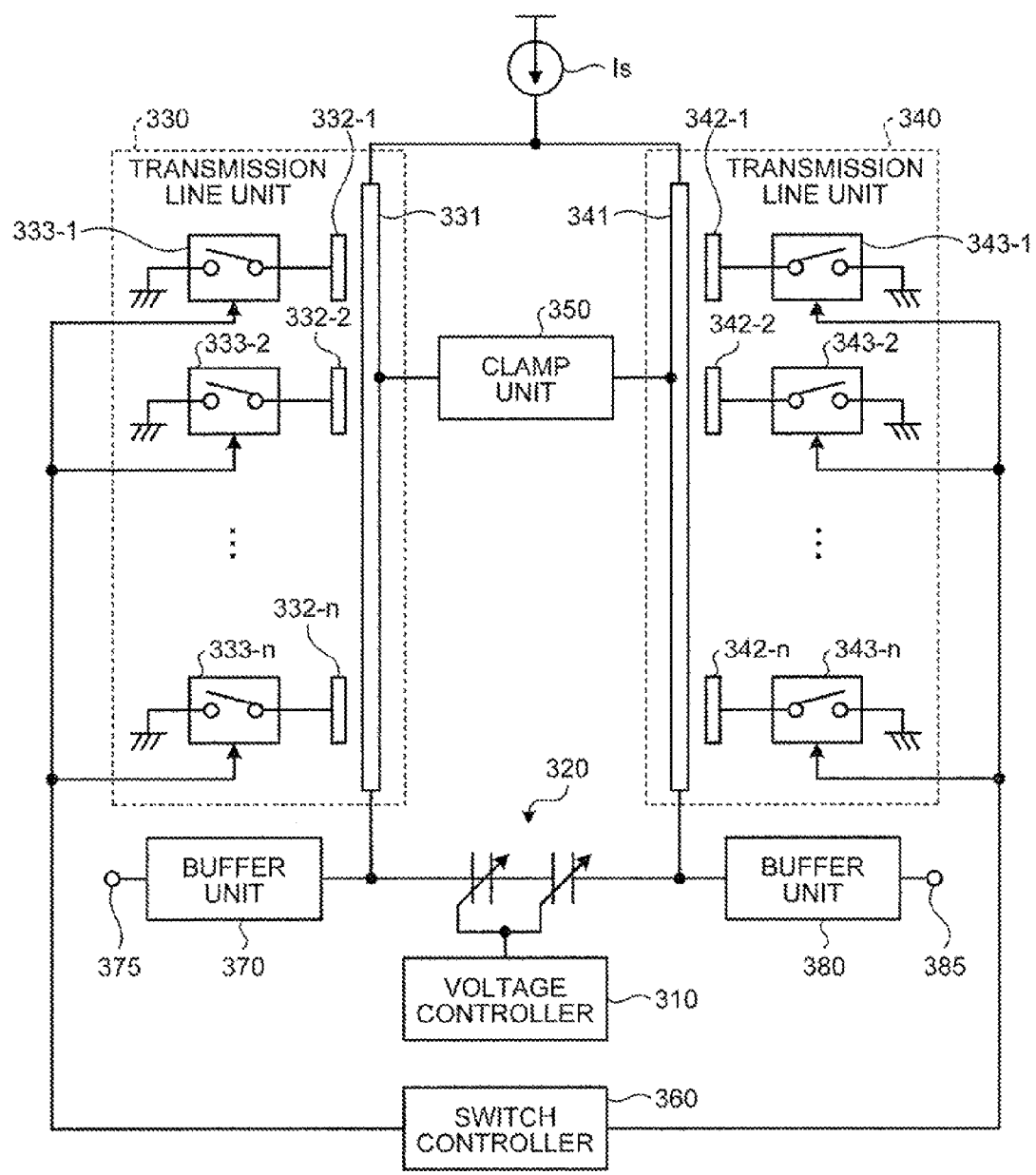
FIG. 15 is a diagram illustrating the configuration of an oscillator according to a third embodiment.

FIG. 15 illustrates the configuration of the oscillator according to the third embodiment. The oscillator illustrated in FIG. 15 has a voltage controller 310, a variable capacitative element 320, transmission line units 330 and 340, a clamp unit 350, a switch controller 360, buffer units 370 and 380, and output terminals 375 and 385.

The voltage controller 310 controls a voltage that is applied to the variable capacitative element 320 and changes the capacitance of the variable capacitative element 320.

The variable capacitative element 320 is an element of which the capacitance changes according to the control voltage applied from the voltage controller 310. As the variable capacitative element 320, for example, a capacitor is used. A phase of the standing wave at the terminating ends of the transmission line units 330 and 340 is shifted according to the capacitance of the variable capacitative element 320. Accordingly, if the capacitance of the variable capacitative element 320 increases or decreases, the phase shift amount at the terminating ends of signal lines 331 and 341 of the transmission line units 330 and 340 changes and the frequency of the standing wave changes. However, if the capacitance of the variable capacitative element 320 greatly increases or decreases, the phase shift amount at the terminating ends of the signal lines 331 and 341 excessively increases and the oscillation is not generated at the terminating ends of the signal lines 331 and 341. Accordingly, the capacitance of the variable capacitative element 320 cannot be greatly increased or decreased, and the frequency of the standing wave cannot be flexibly adjusted by only adjusting the control voltage by the voltage controller 310.

The transmission line units 330 and 340 include the signal lines 331 and 341 that are connected to a constant current source Is and the ground layer, respectively. In the transmission line units 330 and 340, a dielectric layer that includes a mixture medium of $SiO_2$ and silicon is interposed between the signal lines 331 and 341 and the ground layer. When a power supply voltage is applied from the constant current source Is, the transmission line units 330 and 340 propagate a traveling wave and generate a standing wave. That is, each of the transmission line units 330 and 340 has almost the same configuration as that of the transmission line unit 130 according to the first embodiment.

The transmission line units 330 and 340 generate standing waves where phases are inverted. Each of the transmission line units 330 and 340 increases or decreases the effective permittivity and changes the frequency of the standing wave over a wide range. Specifically, a frequency f of the standing wave is represented by Equation (1) in the first embodiment, using the light velocity c, the lengths L of the signal lines 331 and 341, the phase shift amounts ΔΦ at the terminating ends of the signal lines 331 and 341, and the effective permittivity Er.

As described above, in the third embodiment, the phase shift amounts ΔΦ at the terminating ends of the signal lines 331 and 341 cannot be increased by greatly increasing or decreasing the capacitance of the variable capacitative element 320. For this reason, the frequency f of the standing wave is adjusted by changing the effective permittivity Er of the transmission line units 330 and 340. Specifically, the transmission line unit 330 has the signal line 331, strips 332-1 to 332-n, and switches 333-1 to 333-n. The transmission line unit 340 has the signal line 341, strips 342-1 to 342-n, and switches 343-1 to 343-n.

The signal lines 331 and 341 are transmission paths of which starting ends are connected to the constant current source Is and terminating ends are connected to the variable capacitative element 320 and the buffer units 370 and 380. The lengths of the signal lines 331 and 341 from the starting ends to the terminating ends are ¾ of the wavelength of the traveling wave used in oscillation. For this reason, if the power supply voltage is applied from the constant current source Is to the signal lines 331 and 341, the signal lines 331 and 341 generate standing waves having the ¾ wavelength where the starting ends connected to the constant current source Is are used as nodes and the terminating ends are used as antinodes. However, the phases of the standing waves at the terminating ends of the signal lines 331 and 341 are shifted by the phase shift amount ΔΦ by the capacitance of the variable capacitative element 320. The frequency f of the standing wave that is generated by the signal lines 331 and 341 is inversely proportional to a square root of the effective permittivity Er in the transmission line units 330 and 340, as illustrated in Equation (1). Accordingly, if the effective permittivity Er increases, the frequency f of the standing wave decreases, and if the effective permittivity Er decreases, the frequency f of the standing wave increases.

Each of the strips 332-1 to 332-n and 342-1 to 342-n is composed of an elongated plate-shaped electrode that is formed of a conductor, such as a metal, and are arranged along the signal lines 331 and 341 such that the strips do not contact the signal lines 331 and 341. The strips 332-1 to 332-n and 342-1 to 342-n are connected to the ground layer through the switches 333-1 to 333-n and 343-1 to 343-n, respectively. Accordingly, if the switches 333-1 to 333-n and 343-1 to 343-n connect the strips 332-1 to 332-n and 342-1 to 342-n and the ground layer, the potential of the strips 332-1 to 332-n and 342-1 to 342-n that are disposed in the vicinity of the signal lines 331 and 341 becomes the ground potential.

The switches 333-1 to 333-n and 343-1 to 343-n switch connection and non-connection of the strips 332-1 to 332-n and 342-1 to 342-n and the ground layer, respectively, under the control from the switch controller 360. As the switches 333-1 to 333-n and 343-1 to 343-n, for example, MOSFETs are used. If the switches 333-1 to 333-n and 343-1 to 343-n connect the strips 332-1 to 332-n and 342-1 to 342-n and the ground layer, the signal lines 331 and 341 become pseudo close to the ground. That is, if the connection and the non-connection of the switches 333-1 to 333-n and 343-1 to 343-n are switched, the distance between the signal lines 331 and 341 and the ground layer is pseudo adjusted. The effective permittivity Er in the transmission line units 330 and 340 can be changed.

Specifically, if the number of connected switches 333-1 to 333-n and 343-1 to 343-n increases, it can be assumed that the signal lines 331 and 341 and the ground layer become close to each other. Since the propagation speed of the traveling wave becomes slow, it can be assumed that the effective permittivity Er increases. If the number of connected switches 333-1 to 333-n and 343-1 to 343-n decreases, it can be assumed that the signal lines 331 and 341 and the ground layer become away from each other. Since the propagation speed of the traveling wave becomes fast, it can be assumed that the effective permittivity Er decreases. Therefore, as illustrated in Equation (4), the frequency of the standing wave changes inversely proportional to the square root of the effective permittivity Er. That is, the frequency of the standing wave can be adjusted by switching the connection and non-connection of the switches 333-1 to 333-n and 343-1 to 343-n.

The clamp unit 350 is connected to a position of the ¼ wavelength from the starting ends of the signal lines 331 and 341 and associates the amplitudes of the standing waves generated in the signal lines 331 and 341 with each other. That is, the clamp unit 350 causes the amplitude of the standing wave generated in the signal line 331 and the amplitude of the standing wave generated in the signal line 341 to become the amplitudes having the same magnitude to be inverted to each other. Accordingly, if the amplitude at the position of the signal line 331 where the clamp unit 350 is connected is positive, the clamp unit 350 causes the amplitude at the position of the signal line 341 where the clamp unit 350 is connected to be negative and causes the magnitudes of the two amplitudes to be equal to each other.

The switch controller 360 controls switching of the connection and non-connection of each of the switches 333-1 to 333-n and 343-1 to 343-n. Specifically, the switch controller 360 simultaneously switches the switches 333-1 to 333-n and 343-1 to 343-n corresponding to each other from a connection state to a non-connection state or from the non-connection state to the connection state. When the oscillation frequency of the oscillator is increased, the switch controller 360 decreases the number of connected switches 333-1 to 333-n and 343-1 to 343-n. When the oscillation frequency of the oscillator is decreased, the switch controller 360 increases the number of connected switches 333-1 to 333-n and 343-1 to 343-n.

Each of the buffer units 370 and 380 has a buffering circuit, and excludes an influence from the side of the output terminals 375 and 385 with respect to the circuit such as the variable capacitative element 320 and the transmission line units 330 and 340 and stably operates the circuit including the variable capacitative element 320 and the transmission line units 330 and 340. That is, the buffer units 370 and 380 have the same configuration as that of the buffer unit 150 in the first embodiment, and output the clock signals corresponding to the frequency f of the standing wave to the output terminals 375 and 385, respectively. However, the outputs from the buffer units 370 and 380 are inverted to each other.

Figure 16A:
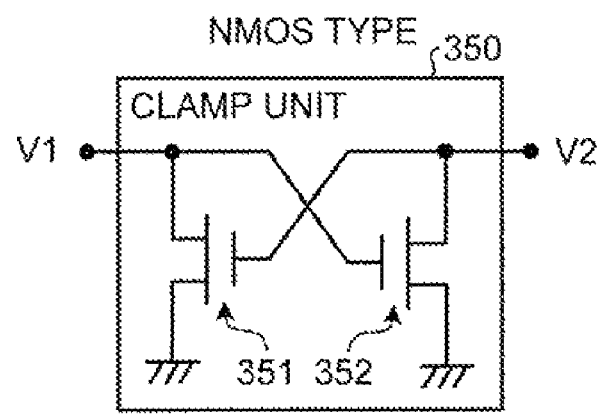
FIGS. 16A and 16B are diagrams illustrating examples of the configuration of a clamp unit according to the third embodiment.
Figure 16B:
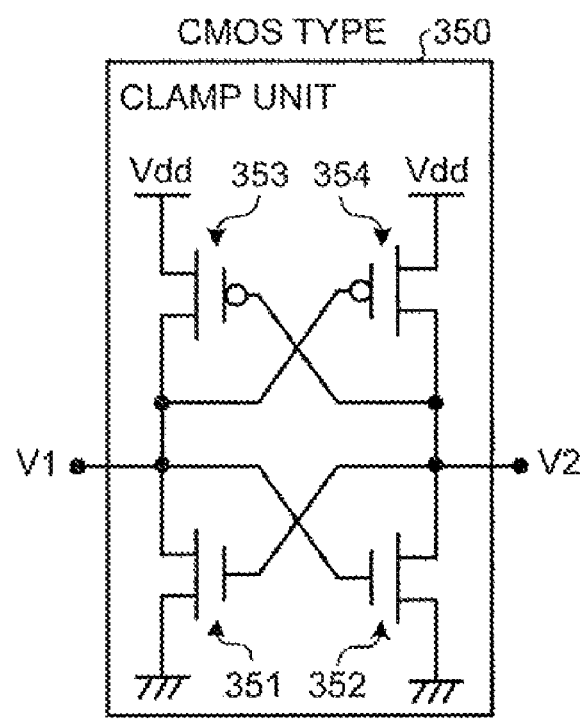

FIGS. 16A and 16B illustrate the configuration of two clamp units 350 of NMOS and CMOS types, as configuration examples of the clamp unit 350 according to the third embodiment.

The clamp unit 350 of the NMOS type is configured by combining NMOS inverters. Specifically, the clamp unit 350 of the NMOS type includes two MOSFETs 351 and 352 that are connected symmetrical to each other. That is, a source of the MOSFET 352 is connected to a gate of the MOSFET 351 and a source of the MOSFET 351 is connected to a gate of the MOSFET 352. In addition, drains of the two MOSFETs 351 and 352 are connected to a ground.

Meanwhile, the clamp unit 350 of the CMOS type is configured by combining CMOS inverters. Specifically, the clamp unit 350 of the CMOS type includes two MOSFETs 353 and 354 in addition to the two MOSFETs 351 and 352. That is, a source of the MOSFET 354 is inversely connected to a gate of the MOSFET 353 and a source of the MOSFET 353 is inversely connected to a gate of the MOSFET 354. In addition, drains of the two MOSFETs 353 and 354 are connected to a power supply.

If the clamp unit 350 is configured using the MOSFETs 351 to 354, two voltages V1 and V2 that are input to the clamp unit 350 are clamped to the same voltage. Accordingly, if the clamp unit 350 is connected to the signal lines 331 and 341, the amplitudes of the standing waves that are generated in the signal lines 331 and 341 can be adjusted to have the same magnitude.

Operation of the Oscillator

Next, the operation of the oscillator that is configured in the above way will be described. If the power supply voltage is applied from the constant current source Is to the signal lines 331 and 341, the standing wave having the frequency f according to the phase shift amount ΔΦ and the effective permittivity Er is generated in the signal lines 331 and 341. At this time, the phase shift amount ΔΦ is determined according to the capacitance of the variable capacitative element 320 and controlled by the voltage controller 310. The effective permittivity Er is adjusted by switching the connection and non-connection of the switches 333-1 to 333-n and 343-1 to 343-n by the switch controller 360.

Specifically, the potential of the strips 332-1 to 332-n that correspond to the switches 333-1 to 333-n becoming a connection state by the switch controller 360 in the transmission line unit 330 becomes the ground potential. For this reason, if the number of connected switches 333-1 to 333-n increases, the signal line 331 and the ground layer become pseudo close to each other. As a result, the propagation speed of the traveling wave that is propagated along the signal line 331 by application of the power supply voltage decreases, and it can be assumed that the effective permittivity Er increases. As the effective permittivity Er increases, the frequency f of the standing wave decreases.

Meanwhile, in the transmission line unit 340, the switches 343-1 to 343-n that are symmetrical to the connected switches 333-1 to 333-n become a connection state by the switch controller 360, and the potential of the corresponding strips 342-1 to 342-n becomes the ground potential. If the number of connected switches 343-1 to 343-n increases, the signal line 341 and the ground layer become pseudo close to each other. As a result, the propagation speed of the traveling wave that is propagated along the signal line 341 by application of the voltage decreases, and it can be assumed that the effective permittivity Er increases. As the effective permittivity Er increases, the frequency f of the standing wave decreases. However, since the signal line 341 is connected to the signal line 331 through the clamp unit 350, if the standing wave generated in the signal line 341 is compared with the standing wave generated in the signal line 331, the magnitudes of the amplitudes are the same, but phases are inverted.

In contrast, if the number of connected switches 333-1 to 333-n and 343-1 to 343-n decreases, the signal lines 331 and 341 and the ground layer become pseudo far away from each other. As a result, the propagation speed of the traveling wave that is propagated along the signal lines 331 and 341 by application of the power supply voltage increases, and it can be assumed that the effective permittivity Er decreases. As the effective permittivity Er decreases, the frequency f of the standing waves that are generated in the signal lines 331 and 341 increases.

Switching of the connection and non-connection of the switches 333-1 to 333-n and 343-1 to 343-n can be performed in the same sequence as that of the first embodiment. That is, in the sequence where the arrangement of the connected switches is equalized, the switch controller 360 switches the switches 333-1 to 333-n and 343-1 to 343-n. At this time, the switch controller 360 causes the switches corresponding to the strips close to the node of the standing wave to become preferentially a connection state.

The capacitance of the variable capacitative element 320 is adjusted by a control voltage applied from the voltage controller 310 to the variable capacitative element 320. In the third embodiment, however, as described above, since the phase shift amount ΔΦ cannot be greatly increased or decreased, the variable range of the capacitance of the variable capacitative element 320 is narrow. As such, even when the variable range of the capacitance of the variable capacitative element 320 is narrow and the phase shift amount ΔΦ is not greatly increased or decreased, in the third embodiment, the variable range of the effective permittivity Er is wide. Therefore, the control range of the frequency f can be widened.

As described above, since the waveform of the standing wave where the frequency f is adjusted has antinodes at the terminating ends of the signal lines 331 and 341, a clock signal that corresponds to the frequency f of the standing wave is output to the output terminals 375 and 385 by the buffer units 370 and 380.

Specific Example of Adjustment of an Oscillation Frequency

FIG. 17 illustrates a specific example of an oscillation frequency of the oscillator according to the third embodiment. In this case, it is assumed that the transmission line units 330 and 340 include eleven switches 333-1 to 333-11 and 343-1 to 343-11, respectively.

As illustrated in FIG. 17, in the transmission line units 330 and 340, when all of the switches are in a non-connection state, the delay of the traveling wave that is propagated along the signal lines 331 and 341 is 8.9 ps. Since the switches are not connected, the effective permittivity Er does not change. Accordingly, even though the frequency band is at both 25 GHz and 40 GHz, the frequency f of the standing wave does not change.

In contrast, when the five switches among the eleven switches are in a connection state, the propagation speed of the traveling wave that is propagated along the signal lines 331 and 341 decreases and the delay becomes 9.3 ps. From this, it can be assumed that the effective permittivity Er increases by 7%. As a result, at the frequency band of 25 GHz, the frequency f decreases by 1.8 GHz. At the frequency band of 40 GHz, the frequency f decreases by 2.8 GHz.

When all of the switches are in a connection state, the delay of the traveling wave becomes 9.6 ps, and it can be assumed that the effective permittivity Er increases by 14%. As a result, at the frequency band of 25 GHz, the frequency f decreases by 3.6 GHz. At the frequency band of 40 GHz, the frequency f decreases by 5.7 GHz.

Accordingly, if the oscillation frequency of when the number of connected switches is five is set as the central frequency, by switching the connection and non-connection of the switches, the oscillation frequency can be increased or decreased by about 1.8 GHz at the frequency band of 25 GHz and can be increased or decreased by about 2.8 GHz at the frequency band of 40 GHz. That is, the oscillation frequency of the sufficiently high frequency band can be flexibly adjusted over a wide band.

As such, according to the third embodiment, in the oscillator where the clock signal having the oscillation frequency of the high frequency band can be output using the two signal lines, the strips that are connected to the ground layer through the switches are disposed in the vicinity of each of the signal lines. By switching the connection and non-connection of the switches, the signal lines and the ground layer are made to become pseudo close to or away from each other. Thereby, the effective permittivity that corresponds to the propagation speed of the traveling wave propagated along the signal lines changes. As a result, the frequency of the standing wave that is generated in the signal lines can be changed, and the oscillation frequency of the high frequency band can be flexibly adjusted over a wide band.

In the third embodiment, the two transmission line units 330 and 340 having the same configuration are provided.

Figure 18:
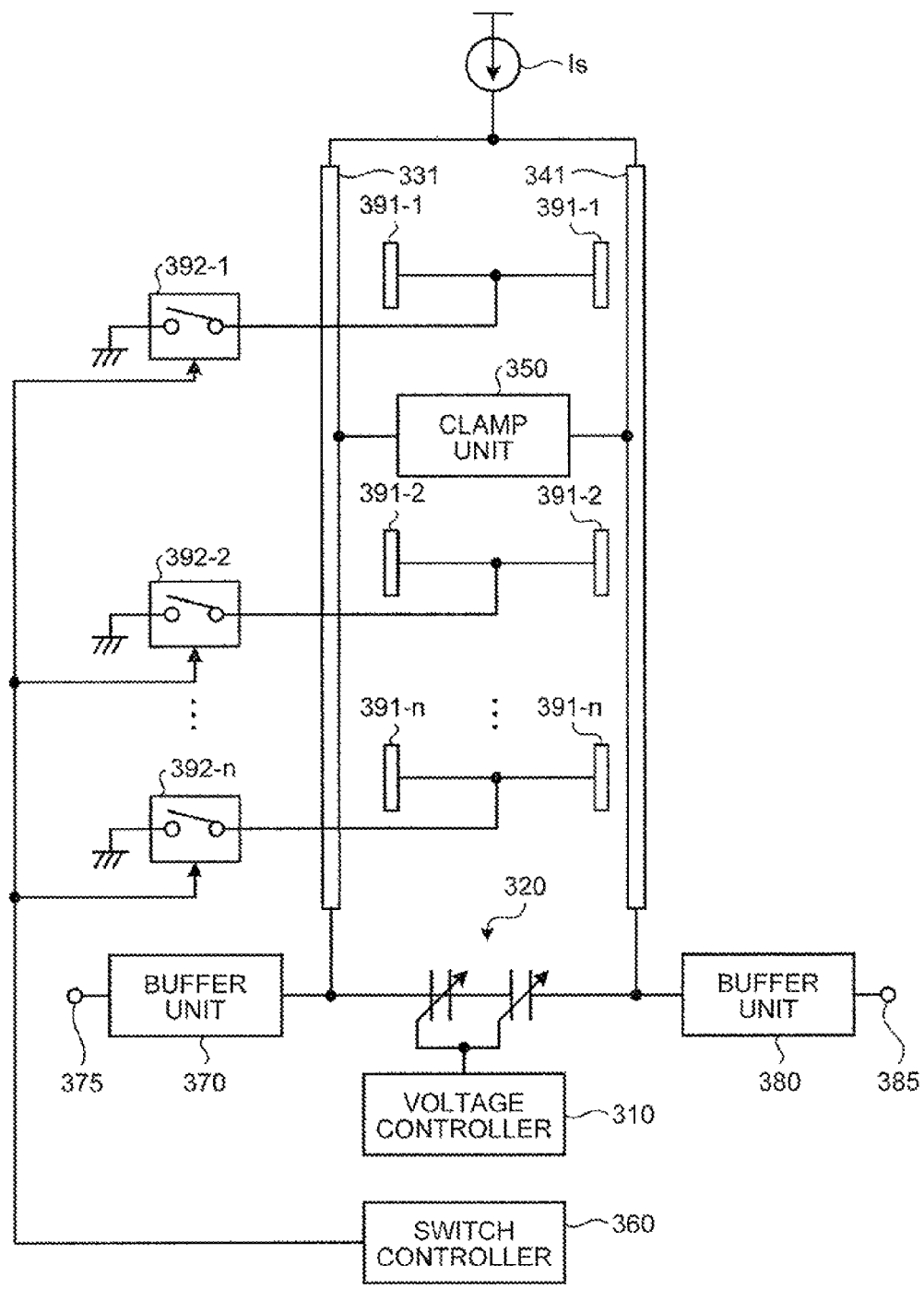
FIG. 18 is a diagram illustrating a modification of the oscillator according to the third embodiment.

However, portions that are common to the transmission line units 330 and 340 may be integrated and the size of the oscillator may be decreased. Specifically, a modification of the oscillator according to the third embodiment is illustrated in FIG. 18. In FIG. 18, the same components as those of FIG. 15 are denoted by the same reference numerals.

In an oscillator illustrated in FIG. 18, facing strips 391-1 to 391-n are provided over both the signal lines 331 and 341. The strips 391-1 to 391-n are connected to the ground layer through switches 392-1 to 392-n, respectively. Accordingly, if the switches 392-1 to 392-n connect the strips 391-1 to 391-n and the ground layer, the potential of the strips 391-1 to 391-n that are disposed in the vicinity of the signal lines 331 and 341 becomes the ground potential.

The switches 392-1 to 392-n switch the connection and non-connection of the strips 391-1 to 391-n and the ground layer, under the control of the switch controller 360. As the switches 392-1 to 392-n, for example, MOSFETs are used. If the switches 392-1 to 392-n connect the strips 391-1 to 391-n and the ground layer, the signal lines 331 and 341 become pseudo close to the ground. That is, if the connection and the non-connection of the switches 392-1 to 392-n are switched, the distance between the signal lines 331 and 341 and the ground layer is pseudo adjusted. The effective permittivity Er in the transmission line units that include the signal lines 331 and 341 can be changed.

Figure 19:
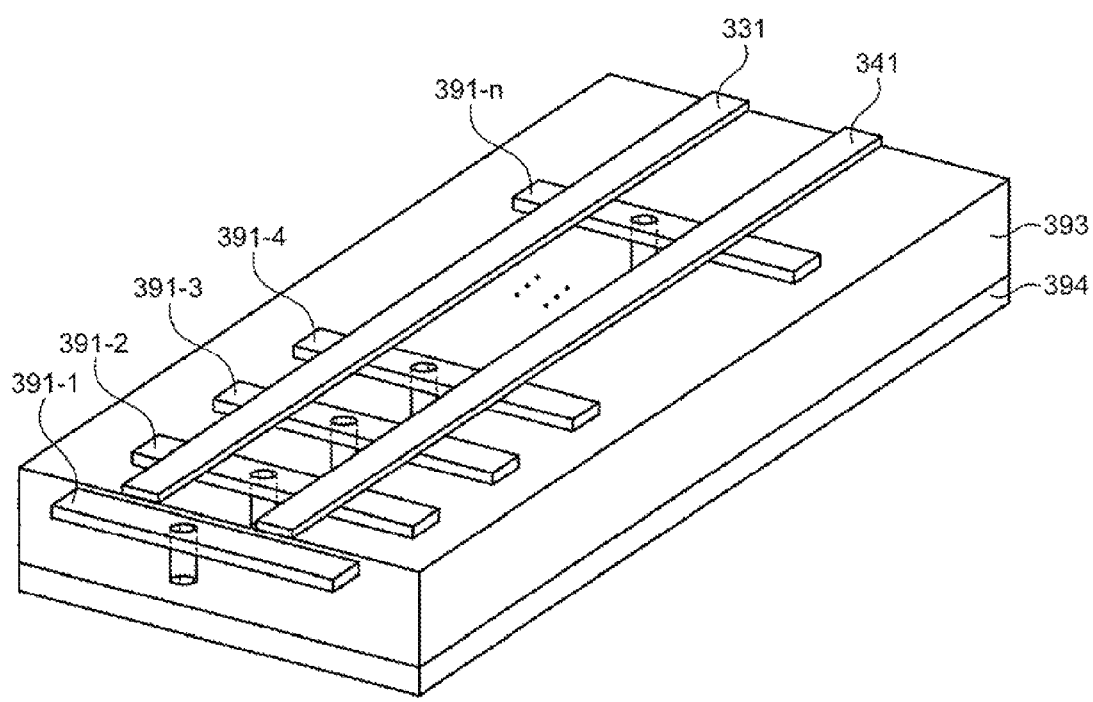
FIG. 19 is a perspective view illustrating a modification of a transmission line unit according to the third embodiment.

FIG. 19 is a perspective view illustrating the configuration of the transmission line unit in the oscillator illustrated in FIG. 18. As illustrated in FIG. 19, the transmission line unit is configured by interposing a dielectric layer 393 between the signal lines 331 and 341 and a ground layer 394, and the strips 391-1 to 391-n and the switches 392-1 to 392-n (not illustrated) are provided in the dielectric layer 393. The dielectric layer 393 is mainly formed of a mixture medium of $SiO_2$ and silicon, and has the configuration where the strips 391-1 to 391-n and the switches 392-1 to 392-n are fixed in the mixture medium. The dielectric layer 393 functions as one dielectric body as a whole. The ground layer 394 is connected to a ground and the potential thereof is always maintained at the ground potential.

The strips 391-1 to 391-n face over both the signal lines 331 and 341 and are disposed at an equivalent interval. In FIG. 19, it is assumed that one end of each of the signal lines 331 and 341 at the lower left of the figure is a starting end connected to the constant current source Is and the other end of each of the signal lines 331 and 341 at the upper right of the figure is a terminating end connected to the buffer units 370 and 380. That is, it is assumed that a propagation direction of the traveling wave of the signal lines 331 and 341 is a direction toward the strip 391-n from the strip 391-1. The strips 391-1 to 391-n are connected to the switches 392-1 to 392-n (not illustrated), respectively.

As such, in the transmission line unit illustrated in FIG. 19, the strips and the switches are not provided with respect to each of the signal lines 331 and 341, but the strips 391-1 to 391-n and the switches 392-1 to 392-n that are common to the signal lines are provided. For this reason, the size of the transmission line unit can be decreased and the size of the oscillator can be decreased.

Figure 20:
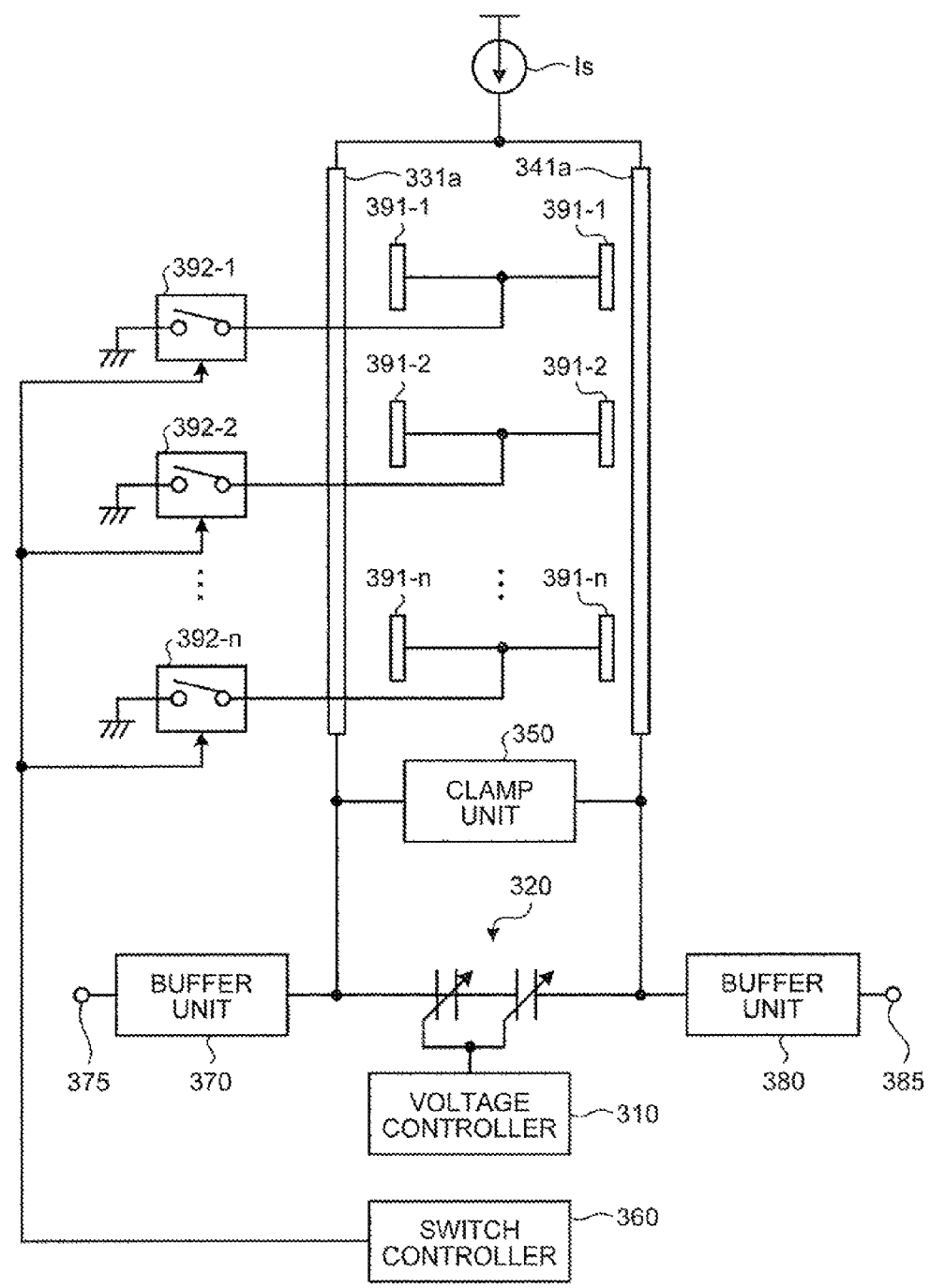
FIG. 20 is a diagram illustrating a modification of the oscillator according to the third embodiment.

For example, as illustrated in FIG. 20, the clamp unit 350 may be provided to be closer to the buffer units 370 and 380 than the terminating ends of signal lines 331a and 341a. In this case, the length of each of the signal lines 331a and 341a from the starting end to the terminating end can be set to ¼ of the wavelength of the traveling wave used in oscillation, and the size of the oscillator can be decreased. That is, the lengths of the signal lines 331 and 341 illustrated in FIG. 18 are set to ¾ of the wavelength of the traveling wave. However, the lengths of the signal lines 331a and 341a illustrated in FIG. 20 are set to ¼ of the wavelength of the traveling wave, which results in decreasing the size of the entire oscillator. By shortening the signal lines 331a and 341a, the clamp unit 350 associates the amplitudes at two points on extended lines of the signal lines 331a and 341a with each other. Thereby, the oscillation frequency of the high frequency band can be flexibly adjusted over a wide band and the size of the oscillator can be decreased.

[d] Fourth Embodiment

In a fourth embodiment, in an oscillator that has a signal line of which both ends become antinodes of a standing wave and an auxiliary signal line having an arc shape, the strips are disposed in the vicinity of the signal lines and an oscillation frequency of the oscillator having a small size is flexibly adjusted over a wide band.

Configuration of the Oscillator

Figure 21:
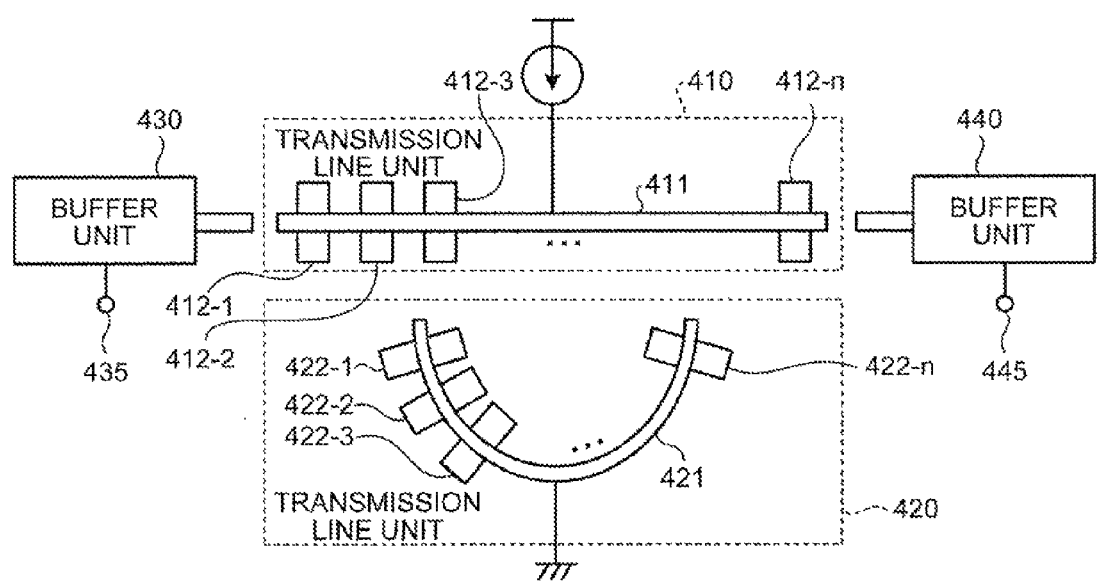
FIG. 21 is a diagram illustrating the configuration of an oscillator according to a fourth embodiment.

FIG. 21 illustrates the configuration of the oscillator according to the fourth embodiment. The oscillator illustrated in FIG. 21 has transmission line units 410 and 420, buffer units 430 and 440, and output terminals 435 and 445.

The transmission line unit 410 includes a signal line 411 that is connected to the constant current source and a ground layer. In the transmission line unit 410, a dielectric layer that includes a mixture medium of $SiO_2$ and silicon is interposed between the signal line 411 and the ground layer. When a power supply voltage is applied from the constant current source, the transmission line unit 410 propagates a traveling wave and generates a standing wave that has the half wavelength. That is, the transmission line unit 410 generates a standing wave where both ends of the signal line 411 become antinodes. Specifically, the transmission line unit 410 has the signal line 411 and strips 412-1 to 412-n.

Both ends of the signal line 411 are connected to the buffer units 430 and 440, respectively, and a central portion thereof is connected to the constant current source. The length of the signal line 411 is ½ of the wavelength of the traveling wave used in oscillation. Accordingly, the lengths from a connection portion of the signal line 411 with the constant current source to both ends are equal to the ¼ wavelength. For this reason, if the power supply voltage is applied from the constant current source, the signal line 411 generates a standing wave having the ½ wavelength where the central portion connected to the constant current source is used as a node and both ends are set as the antinodes.

The strips 412-1 to 412-n are connected to the ground layer through switches (not illustrated), respectively, and are arranged along the signal line 411 such that the strips do not contact the signal line 411. Accordingly, if the switches (not illustrated) connect the strips 412-1 to 412-n and the ground layer, the potential of the strips 412-1 to 412-n that are disposed in the vicinity of the signal line 411 becomes the ground potential.

As such, the configuration of the transmission line unit 410 according to the fourth embodiment is the same as that of the transmission line unit 130 according to the first embodiment, except that the power supply is connected to the central portion of the signal line 411 and the power supply voltage is applied, and the length of the signal line 411 is the ½ wavelength.

The transmission line unit 420 is an auxiliary transmission line unit that is provided to remove an extra frequency component generated in the transmission line unit 410. Specifically, the transmission line unit 420 has a signal line 421 and strips 422-1 to 422-n.

The signal line 421 is curved in an arc shape and a central portion thereof is connected to a ground. The length of the signal line 421 is ½ of the wavelength of the traveling wave, similar to the signal line 411. The signal line 421 is disposed such that the signal lines 411 and 421 form a line-symmetric shape with respect to a central line connecting the central portion of the signal line 411 and the central portion of the signal line 421. That is, the central portion of the signal line 411 and the central portion of the signal line 421 face each other.

The strips 422-1 to 422-n are connected to the ground through switches (not illustrated), respectively, and are arranged along the signal line 421 such that the strips do not contact the signal line 421. Accordingly, if the switches (not illustrated) connect the strips 422-1 to 422-n and the ground, the potential of the strips 422-1 to 422-n that are disposed in the vicinity of the signal line 421 becomes the ground potential.

Each of the buffer units 430 and 440 has a buffering circuit, and excludes an influence from the side of the output terminals 435 and 445 with respect to the circuit such as the transmission line units 410 and 420 and stably operates the circuit including the transmission line units 410 and 420. That is, the buffer units 430 and 440 have the same configuration as that of the buffer unit 150 in the first embodiment, and output the clock signals corresponding to the frequency of the standing wave to the output terminals 435 and 445, respectively. However, the outputs from the buffer units 430 and 440 are inverted to each other.

Figure 22:
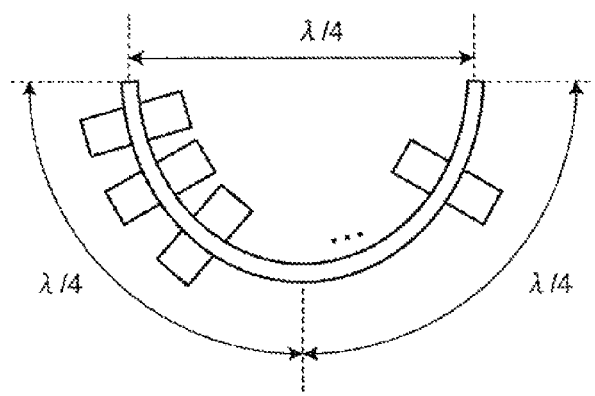
FIG. 22 is a diagram illustrating the configuration of a transmission line unit according to the fourth embodiment.

FIG. 22 illustrates the configuration of the transmission line unit 420 according to the fourth embodiment. As illustrated in FIG. 22, the signal line 421 is formed to be curved, such that the length from both ends to the central portion is ¼ of the wavelength of the traveling wave and the distance between both ends is ¼ of the wavelength of the traveling wave. As described above, since the length of the signal line 411 is also ½ of the wavelength of the traveling wave, the length of the signal line is short as compared with the oscillator in the first embodiment. As a result, the sizes of the transmission line units 410 and 420 can be decreased and a mounting area of the oscillator can be decreased.

Operation of the Oscillator

Next, the operation of the oscillator that has the above configuration will be described. If the power supply voltage is applied from the constant current source to the central portion of the signal line 411, a standing wave having the ½ wavelength is generated in the signal line 411. At this time, since the signal line 421 is disposed in the vicinity of the signal line 411, extra frequency components, such as second harmonics or third harmonics, which are generated in the signal line 411, are removed. The effective permittivity in the transmission line unit 410 is adjusted by selectively adjusting the potential of the strips 412-1 to 412-n to the ground potential. That is, the strips 412-1 to 412-n are connected to the switches (not illustrated). If the switches become a connection state, the potential of the corresponding strips 412-1 to 412-n becomes the ground potential.

If the number of connected switches increases, the signal line 411 and the ground layer become pseudo close to each other, and it can be assumed that the effective permittivity increases. As a result, the frequency of the standing wave that is generated in the signal line 411 decreases. In contrast, if the number of connected switches decreases, the signal line 411 and the ground layer become pseudo far away from each other, and it can be assumed that the effective permittivity decreases. As a result, the frequency of the standing wave that is generated in the signal line 411 increases.

When the switches are switched and the potential of the strips 412-1 to 412-n is adjusted to the ground potential, the switches (not illustrated) are switched even in the transmission line unit 420, and the potential of the corresponding strips 422-1 to 422-n also becomes the ground potential.

As such, the waveform of the standing wave where the frequency is adjusted has the antinodes at both ends of the signal line 411. Therefore, the clock signal having the frequency of the standing wave is output to the output terminals 435 and 445 by the buffer units 430 and 440.

As such, according to the fourth embodiment, in the small oscillator using the signal line that has the length corresponding to ½ of the wavelength, the strips that are connected to the ground layer through the switches are disposed in the vicinity of the signal lines. If the connection and non-connection of the switches are switched, the signal lines and the ground layer are made to become pseudo close to or away from each other. Thereby, the effective permittivity that corresponds to the propagation speed of the traveling wave propagated along the signal lines changes. As a result, the frequency of the standing wave that is generated in the signal lines can be changed, and the oscillation frequency of the small oscillator can be flexibly adjusted over a wide band.

In the fourth embodiment, the transmission line units 410 and 420 are separately provided. However, similar to the modification of the third embodiment, portions that are common to the transmission line units 410 and 420 may be integrated and the size of the oscillator may be decreased. That is, the strips 412-1 to 412-n of the transmission line unit 410 and the strips 422-1 to 422-n of the transmission line unit 420 that correspond to each other may be integrated, and the integrated strips may be connected to the ground layer through the switches.

In the second to fourth embodiments, the interval between the plural strips or the plural semiconductor strips is not described, but the strips or the semiconductor strips may be disposed in an arbitrary type. That is, in the second to fourth embodiments, similar to the first embodiment, the plural strips or the plural semiconductor strips may be disposed at an equivalent interval. The plural strips or the plural semiconductor strips may be disposed to be closer to the nodes of the standing wave than the antinodes of the standing wave.

The length of the signal line is set to ¾ of the wavelength of the traveling wave in the first to third embodiments, and the length of the signal line is set to ½ of the wavelength of the traveling wave in the fourth embodiment. Theses lengths are set to form the antinodes of the standing wave in the ends of the signal lines and oscillate the ends of the signal lines. Accordingly, if the antinodes of the standing wave are formed in the ends of the signal lines, the lengths of the signal lines are not limited to the above lengths. Specifically, if the length from the position of the signal line where the power supply voltage is applied to the oscillating end is odd number times as long as the ¼ wavelength, the antinodes of the standing wave are formed in the ends of the signal lines, and the oscillator can output the clock signal having the oscillation frequency.

Figure 23:
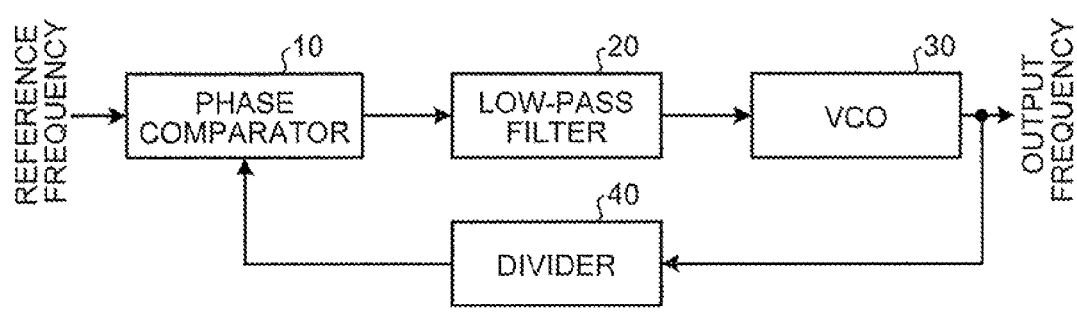
FIG. 23 is a diagram illustrating the configuration of a PLL circuit.

The oscillators according to the first to fourth embodiments can be used in a phase locked loop (PLL) circuit to match an output frequency with a predetermined reference frequency and synchronize phases. FIG. 23 is a block diagram illustrating the configuration of the PLL circuit. The PLL circuit illustrated in FIG. 23 has a phase comparator 10, a low-pass filter 20, a voltage controlled oscillator (VCO) 30, and a divider 40.

The phase comparator 10 compares the reference frequency and a frequency output from the divider 40 and outputs a voltage signal corresponding to a phase difference to the low-pass filter 20. The low-pass filter 20 removes an alternating-current component of the voltage signal and outputs a direct-current component of the voltage signal to the VCO 30.

The VCO 30 includes an oscillator that adjusts an oscillation frequency according to an applied voltage, and outputs a signal having an output frequency according to a direct-current component of the voltage signal that is output from the low-pass filter 20. That is, the VCO 30 includes the oscillator according to the first to fourth embodiments. The VCO 30 switches connection and non-connection of the switches according to the direct-current component of the voltage signal output from the low-pass filter 20 or switches conduction and non-conduction of the semiconductor strips, and flexibly adjusts an output frequency. Thereby, a signal having an output frequency according to the direct-current component of the voltage signal is reliably output from the VCO 30.

The divider 40 divides the output frequency from the VCO 30 and feeds a division result back to the phase comparator 10.

As such, if the oscillator according to the first to fourth embodiment is used in the PLL circuit, the oscillation frequency can be flexibly adjusted in the VCO 30. Accordingly, the PLL circuit can output a signal having an output frequency that is accurately matched with the reference frequency.

According to one aspect of the oscillator and the phase synchronizing circuit disclosed herein, an oscillation frequency can be flexibly adjusted over a wide band, at a sufficiently high frequency band.

[e] Fifth Embodiment

In a fifth embodiment (FIG. 24), an oscillator that has a pair of signal lines connected by a clamp circuit, the strips are disposed in the vicinity of each of the signal lines and a sufficiently high oscillation frequency can be flexibly adjusted over a wide band.

Configuration of the Oscillator

Figure 24:
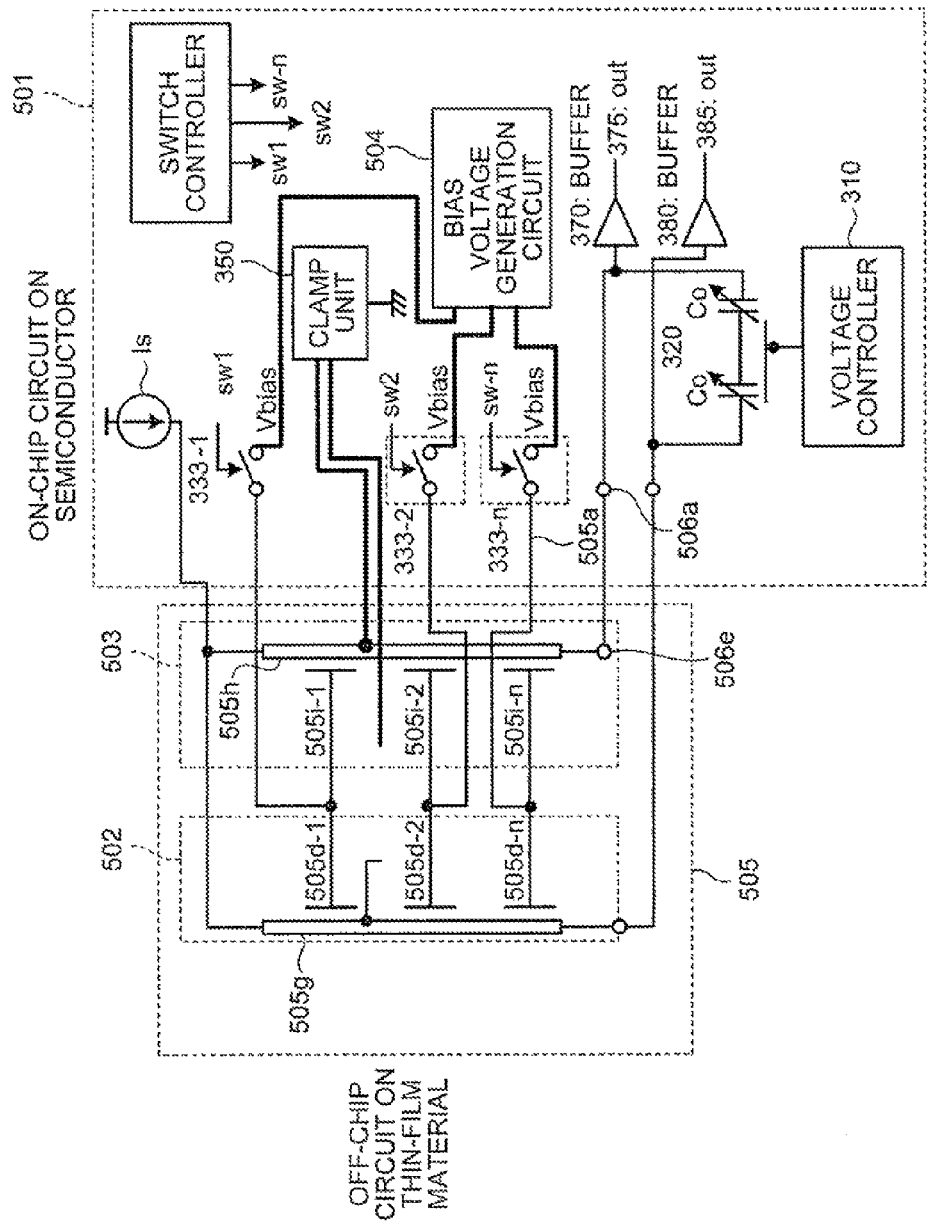
FIG. 24 is a diagram illustrating the configuration of an oscillator according to a fifth embodiment.

FIG. 24 illustrates the configuration of the oscillator according to the fifth embodiment. The oscillator illustrated in FIG. 24 has a voltage controller 310, a variable capacitative element 320, transmission line units 505$g$ and 505$h$, electrodes (505$d$-1, 505$d$-2, ..., 505$d$-$n$), a bias voltage generation circuit 504, a clamp unit 350, switches 333-1 to 333-$n$ and 343-1 to 343-$n$, a switch controller 360, buffer units 370 and 380, and output terminals 375 and 385.

The voltage controller 310, the variable capacitative element 320, the clamp unit 350, the switch controller 360, the buffer units 370 and 380, and the output terminals 375 and 385 of the fifth embodiment are implemented on an on-chip circuit 501 on semiconductor.

The transmission line units 502 and 503 are on an off-chip circuit 505 implemented on thin-film material or ferro-electric material.

The transmission line units 502 and 503 contain transmission signals 505$g$ and 505$h$, and the electrodes (505$d$-1, 505$d$-2, ..., 505$d$-$n$) and (505$i$-1, 505$i$-2, ..., 505$i$-$n$).

The configuration of the voltage controller 310 is almost the same as the configuration (refer to FIGS. 16A, 16B) of the oscillator according to the third embodiment, the description is not repeated here.

The configuration of the variable capacitative element 320 is almost the same as the configuration of the variable capacitative according to the third embodiment, the description is not repeated here.

The bias voltage generation circuit 504 generates the bias voltage potentials, Vbias, which are connected to switches.

The transmission line units 502 and 503 include the signal lines 505$g$ and 505$h$ that are connected to a constant current source Is and the ground layer, respectively. The transmission line units 502 and 503 are embedded inside a thin film layer that includes a mixture medium of thin film material and coating material which is of dielectric constant equal to or higher than 3. When a power supply voltage is applied from the constant current source Is, the transmission line units 502 and 503 propagate a traveling wave and generate a standing wave. That is, each of the transmission line units 505$g$ and 505$h$ has almost the same configuration as that of the transmission line units 330 and 340 according to the third embodiment.

The transmission line units 505$g$ and 505$h$ generate standing waves where phases are inverted. Each of the electrodes (505$d$-1, 505$d$-2, ..., 505$d$-$n$) and (505$i$-1, 505$i$-2, ..., 505$i$-$n$) increases or decreases the effective permittivity and changes the frequency of the standing wave over a wide range. The value of the frequency f of the standing wave is almost the same as represented by Equation (1) in the first embodiment, and the description is not repeated here.

As described above, in the fifth embodiment, the phase shift amounts ΔΦ at the terminating ends of the signal lines 331 and 341 cannot be increased by greatly increasing or decreasing the capacitance of the variable capacitative element 320. For this reason, the frequency f of the standing wave is adjusted by changing the effective permittivity Er of the transmission line units 502 and 503. Specifically, the transmission line unit 502 has the signal line 505$h$, strips 505$d$-1 to 505$d$-$n$, and switches 333-1 to 333-$n$. The transmission line unit 503 has the signal line 505$g$, strips 505$i$-1 to 505$i$-$n$, and switches 333-1 to 333-$n$.

The signal lines 505$g$ and 505$h$ are transmission paths of which starting ends are connected to the constant current source Is and terminating ends are connected to the variable capacitative element 320 and the buffer units 370 and 380. The lengths of the signal lines 331 and 341 from the starting ends to the terminating ends are ¾ of the wavelength of the traveling wave used in oscillation. For this reason, if the power supply voltage is applied from the constant current source Is to the signal lines 505$g$ and 505$h$, the signal lines 505$g$ and 505$h$ generate standing waves having the ¾ wavelength where the starting ends connected to the constant current source Is are used as nodes and the terminating ends are used as antinodes. On the other hand, the phases of the standing waves at the terminating ends of the signal lines 505$g$ and 505$h$ are almost the same as explained in the transmission line units 330 and 340 in the third embodiment, as illustrated in Equation (1), and the description is not repeated here.

Each of the strips 505$d$-1 to 505$d$-$n$ and 505$i$-1 to 505$i$-$n$ is composed of an elongated plate-shaped electrode that is formed of a conductor, such as a metal, and are arranged along the signal lines 502 and 503 such that the strips do not contact the signal lines 505$g$ and 505$h$. The strips 505$d$-1 to 505$d$-$n$ and 505$i$-1 to 505$i$-$n$ are connected to the bias voltage through the switches 333-1 to 333-$n$ and 343-1 to 343-$n$, respectively. Accordingly, if the switches 333-1 to 333-$n$ and 343-1 to 343-*n* connect the strips 505*d*-1 to 505*d*-*n* and 505*i*-1 to 505*i*-*n* and the bias voltage, the potential of the strips 505*d*-1 to 505*d*-*n* and 505*i*-1 to 505*i*-*n* that are disposed in the vicinity of the signal lines 505*g* and 505*h* becomes the bias voltage potential Vbias.

The switches 333-1 to 333-*n* and 343-1 to 343-*n* switch connection and non-connection of the strips 505*d*-1 to 505*d*-*n* and 505*i*-1 to 505*i*-*n* and the bias voltage, respectively, under the control from the switch controller 360. As the switches 333-1 to 333-*n* and 343-1 to 343-*n*, for example, MOSFETs are used. If the switches 333-1 to 333-*n* and 343-1 to 343-*n* connect the strips 332-1 to 332-*n* and 342-1 to 342-*n* and the bias voltage, the dielectric permittivity of the thin film or ferro-electric material in the thin film layer at the vicinity of signal lines 505*g* and 505*h* changes. That is, if the connection and the non-connection of the switches 333-1 to 333-*n* and 343-1 to 343-*n* are switched, the effective permittivity Er in the transmission line units 502 and 503 can be changed.

Specifically, if the number of connected switches 333-1 to 333-*n* and 343-1 to 343-*n* increases, it can be assumed that the electrical transmission distances of signal lines 505*g* and 505*h* increase. Since the propagation speed of the traveling wave becomes slow, it can be assumed that the effective permittivity Er increases. If the number of connected switches 333-1 to 333-*n* and 343-1 to 343-*n* decreases, it can be assumed that electrical transmission distances of the signal lines 331 and 341 decrease. Since the propagation speed of the traveling wave becomes fast, it can be assumed that the effective permittivity Er decreases. Therefore, as represented by Equation (4), the frequency of the standing wave changes inversely proportional to the square root of the effective permittivity Er. That is, the frequency of the standing wave can be adjusted by switching the connection and non-connection of the switches 333-1 to 333-*n* and 343-1 to 343-*n*.

The configuration of the clamp unit 350 is almost the same as described in the clamp unit of the third embodiment. It is connected to a position of the ¼ wavelength from the starting ends of the signal lines 505*g* and 505*h* and associates the amplitudes of the standing waves generated in the signal lines 505*g* and 505*h* with each other. That is, the clamp unit 350 causes the amplitude of the standing wave generated in the signal line 505*g* and the amplitude of the standing wave generated in the signal line 505*h* to become the amplitudes having the same magnitude to be inverted to each other. Accordingly, if the amplitude at the position of the signal line 505*g* where the clamp unit 350 is connected is positive, the clamp unit 350 causes the amplitude at the position of the signal line 505*h* where the clamp unit 350 is connected to be negative and causes the magnitudes of the two amplitudes to be equal to each other.

The configuration of the switch controller 360 is almost the same as described in the third embodiment, and the description is not repeated here.

Each of the buffer units 370 and 380 has a buffering circuit. And, the configuration and function of the buffer units 370 and 380 are almost the same as those described in the third embodiment (FIGS. 16A and 16B), and the description is not repeated here.

Operation of the Oscillator

Next, the operation of the oscillator that is configured in the above way will be described. If the power supply voltage is applied from the constant current source Is to the signal lines 505*g* and 505*h*, the standing wave having the frequency f according to the phase shift amount ΔΦ and the effective permittivity Er is generated in the signal lines 505*g* and 505*h*. At this time, the phase shift amount ΔΦ is determined according to the capacitance of the variable capacitative element 320 and controlled by the voltage controller 310. The effective permittivity Er is adjusted by switching the connection and non-connection of the switches 333-1 to 333-*n* and 343-1 to 343-*n* by the switch controller 360.

Specifically, the potential of the strips 505*d*-1 to 505*d*-*n* that correspond to the switches 333-1 to 333-*n* becoming a connection state by the switch controller 360 in the transmission line unit 330 becomes the bias voltage potential. For this reason, if the number of connected switches 333-1 to 333-*n* increases, the potential at the vicinity of signal line 505*g* become Vbias. As a result, the propagation speed of the traveling wave that is propagated along the signal line 505*g* by application of the power supply voltage decreases, and it can be assumed that the effective permittivity Er increases. As the effective permittivity Er increases, the frequency f of the standing wave decreases.

Meanwhile, in the transmission line unit 503, the electrodes 505*i*-1 to 505*i*-*n* that are symmetrical to the connected switches 333-1 to 333-*n* become a connection state by the switch controller 360, and the potential of the corresponding strips 342-1 to 342-*n* becomes the bias voltage potential. If the number of connected switches 343-1 to 343-*n* increases, the potential at the vicinity of signal line 505*h* become Vbias. As a result, the propagation speed of the traveling wave that is propagated along the signal line 505*h* by application of the voltage decreases, and it can be assumed that the effective permittivity Er increases. As the effective permittivity Er increases, the frequency f of the standing wave decreases. However, since the signal line 505*h* is connected to the signal line 505*g* through the clamp unit 350, if the standing wave generated in the signal line 503 is compared with the standing wave generated in the signal line 502, the magnitudes of the amplitudes are the same, but phases are inverted.

In contrast, if the number of connected switches 333-1 to 333-*n* decreases, the potential at the vicinity of signal lines 505*g* and 505*g* become close to the default voltage value, that is ground voltage. As a result, the propagation speed of the traveling wave that is propagated along the signal lines 505*g* and 505*h* by application of the power supply voltage increases, and it can be assumed that the effective permittivity Er decreases. As the effective permittivity Er decreases, the frequency f of the standing waves that are generated in the signal lines 505*g* and 505*h* increases.

Switching of the connection and non-connection of the switches 333-1 to 333-*n* and 343-1 to 343-*n* can be performed in the same sequence as that of the first embodiment or the third embodiment. The sequence of switching is almost the same as described in the first embodiment and the third embodiment, and the description is not repeated here.

The capacitance of the variable capacitative element 320 is adjusted by a control voltage applied from the voltage controller 310 to the variable capacitative element 320. In the fifth embodiment, however, as described above, since the dielectric permittivity of the thin film material or ferro-electric material in the thin film layer can be adjusted and the phase shift amount ΔΦ cannot be greatly increased or decreased, the variable range of the capacitance of the variable capacitative element 320 is narrow. As such, even when the variable range of the capacitance of the variable capacitative element 320 is narrow and the phase shift amount ΔΦ is not greatly increased or decreased, in the fifth embodiment, the variable range of the effective permittivity Er is wide. Therefore, the control range of the frequency f can be widened.

Figure 25:
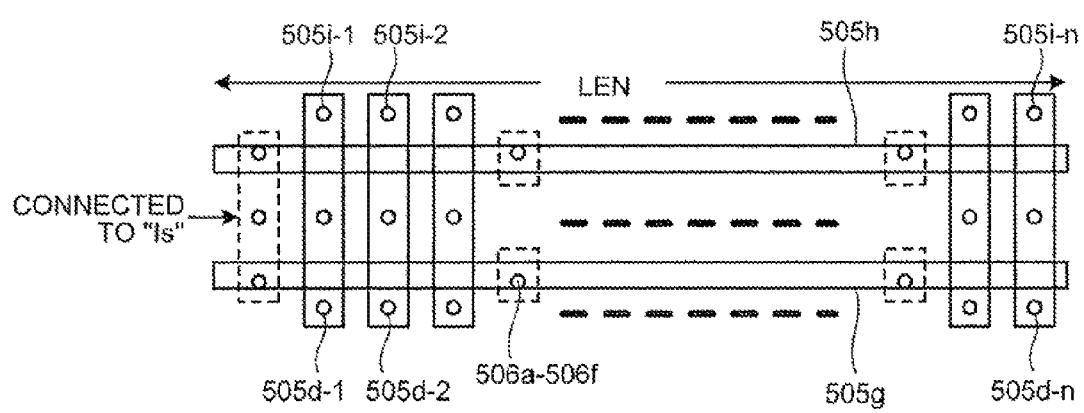
FIG. 25 is a schematic plan view illustrating the configuration of the transmission line units according to the fifth embodiment.

FIG. 25 is a schematic plan view illustrating the configuration of the transmission line units 505*g* and 505*h* according to the fifth embodiment. As illustrated in FIG. 25, one side of the signal line 505g and 505h are connected to the current source Is. The electrodes 505i-1 to 505i-n are located at outermost sides of the signal lines 505g and 505h. The signal lines 505g and 505h are connected to the clamp unit 350 through vias 506a to 506f.

Figure 26:
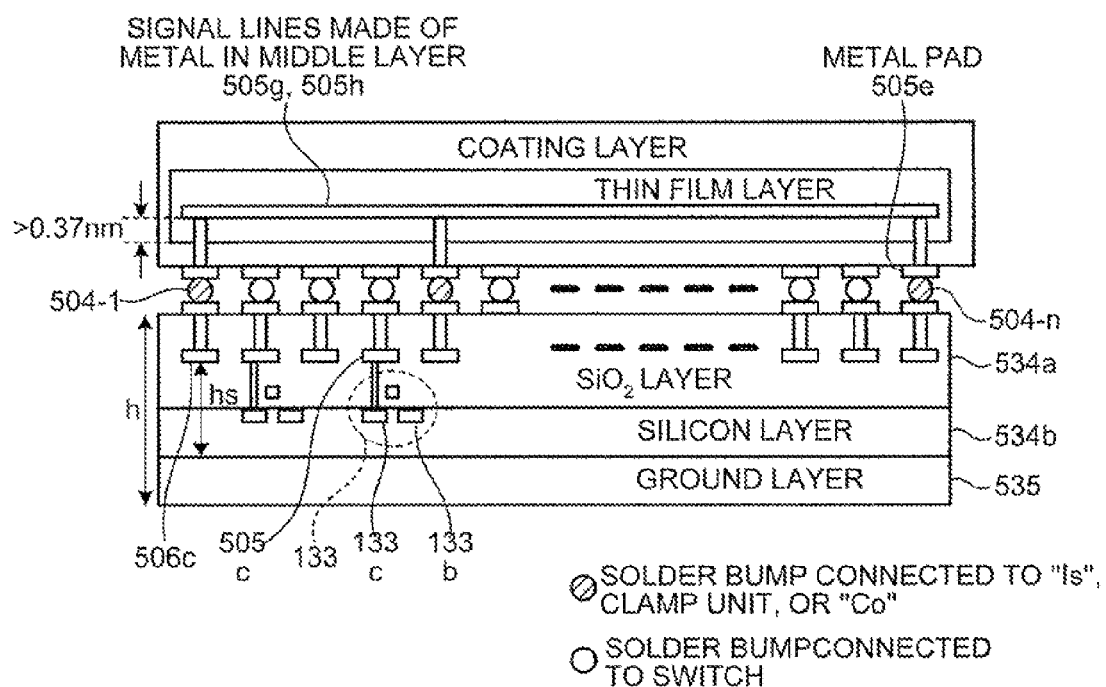
FIG. 26 is a schematic lateral view illustrating the configuration of the transmission line units according to the fifth embodiment.

FIG. 26 is a schematic lateral view illustrating the configuration of the transmission line unit 502 according to the fifth embodiment. As illustrated in the upper part of FIG. 26, the transmission line unit 502 has a layered structure, and the signal line 505g, a thin film layer, and a coating layer in the off-chip circuit. The thin film layer 521 and the coating layer 522 form the off-chip layer 520.

As illustrated in the lower part of FIG. 26, switches 133-1 to 133-n are implemented in the SiO$_2$ layer 534a, a silicon layer 534b, and the ground layer 535 at the lowermost side of the figure.

The configuration of the MOSFETs formed in the on-chip circuit is almost the same as that described in the first embodiment, and is not described here. There are vias which connect the signal pads 505c, 506c, etc. to the metal electrodes on the surface of the on-chip circuit, such that they can be connected to the off-chip circuit.

The on-chip electrodes and off-chip electrodes are connected through solder bumps 540-1 to 540-n.

The bias voltage generation circuit generates bias voltages which range from a negative voltage to a voltage which is equal to or larger than 20 V.

Configuration of the Switch

Figure 27:
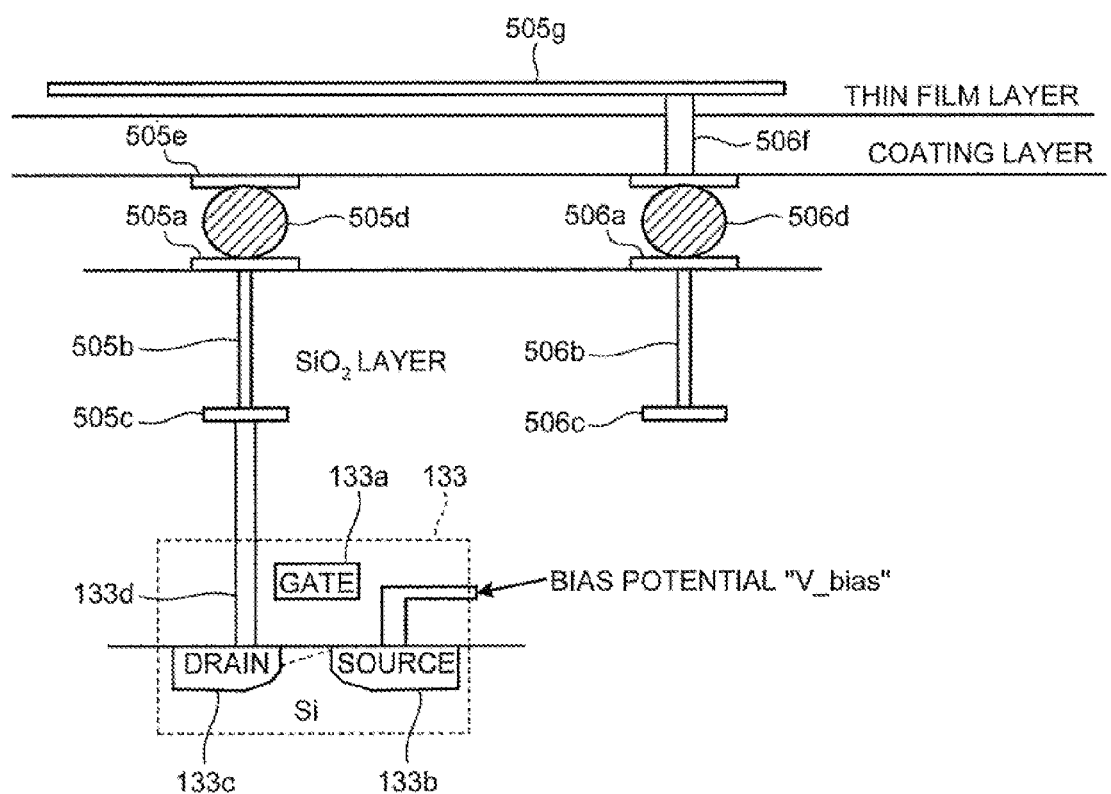
FIG. 27 is a diagram illustrating an example of the configuration of a switch and a connection to clamp circuit according to the fifth embodiment.

The left part of FIG. 27 illustrates an example of the configuration of the switch 133 according to the fifth embodiment. The configuration of the MOSFETs formed in the on-chip circuit is almost the same as that described in the first embodiment, and is not described here.

The left part of FIG. 27 illustrates an example of a connection between off-chip transmission signal line 505g and the on-chip clamp circuit 350 according to the fifth embodiment.

The on-chip circuit at the lower parts of FIGS. 26 and 27 can be formed using a standard CMOS process.

Meanwhile, the off-chip circuit at the upper parts of FIGS. 26 and 27 can be easily manufactured on thin-film technology.

As a result, the whole circuit can be manufactured on nowadays technologies.

FIG. 28 is a table of chemical names, formula and dielectric constants of several examples of thin film material to be used in the off-chip circuit.

FIG. 29 is a table of chemical names, formula and dielectric constants of several examples of ferro-electric material to be used in the off-chip circuit.

Meanwhile, when the metal strips are connected to the bias voltage, they change the effective dielectric constant of the space under signal line. Since material of high dielectric thin film material can be selected, size of off-chip circuit can further be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An oscillator comprising:
a signal line that has a voltage applied portion to which a power supply voltage is applied and propagates a traveling wave according to application of the power supply voltage, the length from the voltage applied portion to at least one end being based on wave length of the propagated traveling wave;
a maintaining unit that maintains a standing wave generated in the signal line according to the traveling wave propagated by the signal line;
an output unit that outputs a signal having an oscillation frequency using the standing wave maintained by the maintaining unit;
a plurality of potential changing electrodes each including a facing portion, which faces the signal line and of which the potential changes to the ground potential; and
a controller that adjusts the oscillation frequency of the signal output from the output unit by increasing the number of potential charming electrodes where the potential of the facing portion becomes the ground potential when the oscillation frequency of the signal output by the output unit is increased, and by decreasing the number of potential changing electrodes where the potential of the facing portion becomes the ground potential when the oscillation frequency of the signal output by the output unit is decreased,
wherein
the controller changes a potential of the potential changing electrodes to a ground potential in the sequence starting from the potential changing electrodes close to the position of the voltage applied portion of the signal line or the position away from the voltage applied portion by integer times as long as the ½ wavelength of the traveling wave when the controller increases the number of potential changing electrodes where the potential of the facing portion becomes the ground potential.

2. The oscillator according to claim 1,
wherein the length of the signal line is odd number times as long as the ¼ wavelength of the propagated traveling wave.

3. The oscillator according to claim 1,
wherein the potential changing electrode is composed of a conductor that is disposed to face the signal line, and
the controller includes a switching unit that switches connection and non-connection of the conductor and a ground whose potential is maintained at the ground potential and a switch controller that controls switching of the connection and non-connection in the switching unit.

4. The oscillator according to claim 1,
wherein the potential changing electrode is composed of a semiconductor that has a first terminal applied with a control voltage, a second terminal connected to a ground whose potential is maintained at the ground potential, and a third terminal including the facing portion, and switches conduction and non-conduction between the second and third terminals according to the control voltage applied to the first terminal, and
the controller adjusts the control voltage applied to the first terminal and controls switching of the conduction and non-conduction between the second and third terminals.

5. The oscillator according to claim 1,
wherein one end of the signal line is provided with the voltage applied portion, and the length of the signal line from one end to the other end is odd number times as long as the ¼ wavelength of the propagated traveling wave.

6. The oscillator according to claim 1,
wherein a central portion of the signal line is provided with the voltage applied portion, and the lengths of the signal line from the central portion to both ends are odd number times as long as the ¼ wavelength of the propagated traveling wave.

7. The oscillator according to claim 1,
wherein the controller changes the potential of the facing portion included in the potential changing electrode to the ground potential, when the oscillation frequency of the signal output by the output unit is increased.

8. The oscillator according to claim 1, further comprising:
a variable capacitative element that is connected to the end of the signal line and has a capacitance which may be changed according to the applied control voltage.

9. The oscillator according to claim 1,
wherein the plurality of potential changing electrodes are disposed at an equivalent intervals along the signal line.

10. The oscillator according to claim 1,
wherein the plurality of potential changing electrode are densely disposed to be closer to the voltage applied portion of the signal line than the end of the signal line.

11. The oscillator according to claim 1,
wherein the controller changes the potential of the plurality of potential changing electrodes to the ground potential in a sequence where arrangement of the potential changing electrodes whose potential becomes the ground potential is equalized, when the controller increases the number of potential changing electrodes where the potential of the facing portion becomes the ground potential.

12. The oscillator according to claim 1, further comprising a bias voltage generation circuit,
wherein a potential of the potential changing electrodes becomes a bias voltage potential generated by the bias voltage generation circuit.

13. The oscillator according to claim 1, further comprising another signal line,
wherein the maintaining unit connects the signal line and the another signal line to each other and associates amplitudes of standing waves generated in the two signal lines with each other.

14. The oscillator according to claim 1, further comprising:
an auxiliary signal line that is disposed in the vicinity of the signal line, has the same length as the signal line, and is curved to have the distance between both ends becoming ½ of the length of the signal line.

15. An oscillator comprising:
a signal line that has a voltage applied portion to which a power supply voltage is applied and propagates a traveling wave according to application of the power supply voltage, the length from the voltage applied portion to at least one end being odd number times as long as the ¼ wavelength of the propagated traveling wave;
a plurality of potential changing electrodes;
a changing unit that changes effective permittivity corresponding to a propagation speed of the traveling wave in the signal line by increasing or decreasing the number of the potential changing electrodes where potential becomes ground potential; and
an output unit that outputs a signal having an oscillation frequency using the traveling wave propagated by the signal line, after the effective permittivity is changed by the changing unit, wherein
the changing unit changes a potential of the potential changing electrodes to a ground potential in the sequence starting from the potential changing electrodes close to the position of the voltage applied portion of the signal line or the position away from the voltage applied portion by integer times as long as the ½ wavelength of the traveling wave, when the changing unit increases the number of potential changing electrodes where the potential becomes the ground potential.

16. A phase synchronizing circuit, comprising:
an oscillator that outputs a signal having an oscillation frequency according to an input voltage; and
a comparator that compares the oscillation frequency of the signal output by the oscillator and a predetermined reference frequency and inputs an input voltage corresponding to a difference between the oscillation frequency and the reference frequency to the oscillator,
wherein the oscillator includes
a signal line that has a voltage applied portion to which a power supply voltage is applied and propagates a traveling wave according to application of the power supply voltage, the length from the voltage applied portion to at least one end being odd number times as long as the ¼ wavelength of the propagated traveling wave;
a plurality of potential changing electrodes each including a facing portion, which faces the signal line in the vicinity of the signal line and of which the potential changes to the ground potential;
a controller that the oscillation frequency of the signal according to the input voltage from the comparator by increasing the number of potential changing electrodes where the potential of the facing portion becomes the ground potential when the oscillation frequency of the signal is increased, and by decreasing the number of potential changing electrodes where the potential of the facing portion becomes the ground potential when the oscillation frequency of the signal is decreased; and
an output unit that outputs a signal having an oscillation frequency using the traveling wave propagated by the signal line, after the potential of the facing portion is changed by the control from the controller,
wherein the controller changes a potential of the potential changing electrodes to a ground potential in the sequence starting from the potential changing electrodes close to the position of the voltage applied portion of the signal line or the position away from the voltage applied portion by integer times as long as the ½ wavelength of the traveling wave, when the controller increases the number of potential changing electrodes where the potential of the facing portion becomes the ground potential.

17. The oscillator according to claim 1,
wherein the signal line that propagates a traveling wave, and the potential changing electrode are implemented on a substrate different from the substrate of other parts of the oscillator.

* * * * *